US012593582B2

(12) United States Patent
Kwak et al.

(10) Patent No.: US 12,593,582 B2
(45) Date of Patent: Mar. 31, 2026

(54) DISPLAY DEVICE

(71) Applicant: Samsung Display Co., LTD., Yongin-si (KR)

(72) Inventors: Yun Hee Kwak, Yongin-si (KR); Ji Hyeon Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/044,473

(22) Filed: Feb. 3, 2025

(65) Prior Publication Data

US 2025/0386688 A1    Dec. 18, 2025

(30) Foreign Application Priority Data

Jun. 14, 2024    (KR) ........................ 10-2024-0077408

(51) Int. Cl.
| | |
|---|---|
| *G09G 3/00* | (2006.01) |
| *G09G 3/3241* | (2016.01) |
| *H10K 59/121* | (2023.01) |
| *H10K 59/131* | (2023.01) |
| H10K 59/35 | (2023.01) |

(52) U.S. Cl.
CPC .......... *H10K 59/131* (2023.02); *G09G 3/006* (2013.01); *G09G 3/3241* (2013.01); *H10K 59/1213* (2023.02); *G09G 2300/0819* (2013.01); *G09G 2300/0842* (2013.01); *G09G 2330/12* (2013.01); *H10K 59/353* (2023.02)

(58) Field of Classification Search
CPC ........ G06T 2207/30108; G06T 7/0004; G09G 2300/0452; G09G 2320/0233; G09G 2320/0693; G09G 2330/10; G09G 2354/00; G09G 2360/145; G09G 2360/147; G09G 3/006; G09G 3/20; G09G 3/2003
See application file for complete search history.

(56) References Cited

U.S. PATENT DOCUMENTS

| | | | | |
|---|---|---|---|---|
| 2018/0203315 A1* | 7/2018 | Wang | ................ | G02F 1/136286 |
| 2021/0036089 A1* | 2/2021 | Li | ......................... | H10K 71/70 |

FOREIGN PATENT DOCUMENTS

| | | |
|---|---|---|
| CN | 116056504 A | 5/2023 |
| KR | 10-2270632 B1 | 6/2021 |
| KR | 10-2021-0114577 A | 9/2021 |
| KR | 10-2023-0060563 A | 5/2023 |
| KR | 10-2023-0095147 A | 6/2023 |

* cited by examiner

*Primary Examiner* — Insa Sadio
(74) *Attorney, Agent, or Firm* — Womble Bond Dickinson (US) LLP

(57) ABSTRACT
There is provided a display device including a substrate, a circuit layer above the substrate, and an element layer above the circuit layer. The circuit layer includes light-emitting pixel drivers, data lines, and a defect inspection circuit unit. The data lines include a first data line, a second data line, a third data line, and a fourth data line arranged adjacent to each other in a first direction. The defect inspection circuit unit includes a first inspection transistor electrically connected between the first data line and a first inspection signal supply line, a second inspection transistor electrically connected between the second data line and a second inspection signal supply line, a third inspection transistor electrically connected between the third data line and a third inspection signal supply line, and a fourth inspection transistor electrically connected between the fourth data line and the second inspection signal supply line.

20 Claims, 18 Drawing Sheets

FIG. 1

110: MA, SBA

FIG. 3

DL: DL1, DL2, DL3, DL4
DSPL: DSPL1, DSPL2, DSPL3, DSPL4

DL: DL1, DL2, DL3, DL4
DSPL: DSPL1, DSPL2, DSPL3, DSPL4

DISPLAY DEVICE

CROSS-REFERENCE TO RELATED APPLICATION

The present application claims priority to, and the benefit of, Korean Patent Application No. 10-2024-0077408 filed on Jun. 14, 2024 in the Korean Intellectual Property Office, the disclosure of which in its entirety is incorporated herein by reference.

BACKGROUND

1. Technical Field

The present disclosure relates to a display device.

2. Description of the Related Art

With the advance of information-oriented society, more and more demands are placed on display devices for displaying images in various ways. For example, display devices are employed in various electronic devices, such as smartphones, digital cameras, laptop computers, navigation devices, and smart televisions.

The display device may be a flat panel display device, such as a liquid crystal display device, a field emission display device and a light-emitting display device. Examples of the light-emitting display device may include an organic light-emitting display device including organic light-emitting elements, an inorganic light-emitting display device including inorganic light-emitting elements, such as inorganic semiconductors, and a micro light-emitting display device including micro light-emitting elements.

The organic light-emitting display device displays an image using light-emitting elements, each including a light-emitting layer made of an organic light-emitting material. As described above, the organic light-emitting display device implements image display using a self-light-emitting element, and thus may have relatively superior performance in power consumption, response speed, luminous efficiency, luminance, and wide viewing angle compared to other display devices.

One surface of the display device may include a display area in which an image is displayed and a non-display area that is a periphery of the display area. Emission areas emitting light with respective luminances and colors may be arranged in the display area.

SUMMARY

To reduce the manufacturing cost of the display device, the display device may include a defect inspection circuit unit for inspecting a defect during manufacturing.

However, as the defect inspection of the display device is carried out in a variety of ways, the defect inspection circuit unit may include circuits for various inspection modes. As an example, the defect inspection circuit unit may include a lighting inspection circuit for lighting inspection and a short-circuit inspection circuit for short-circuit inspection. In this case, the width of the non-display area increases due to the width of the defect inspection circuit unit, and the display device may become vulnerable to static electricity due to switching elements belonging to the defect inspection circuit unit.

In view of the above, aspects of the present disclosure provide a display device including a defect inspection circuit unit that can be operated in two different inspection modes.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including a substrate including a display area in which emission areas are arranged, and a non-display area around the display area, a circuit layer above the substrate, and including light-emitting pixel drivers arranged side by side in a first direction and a second direction, data lines extending in the second direction, configured to transmit a data signal to the light-emitting pixel drivers, and including a first data line, a second data line, a third data line, and a fourth data line arranged adjacent to each other in the first direction, and a defect inspection circuit unit at the non-display area, and configured to supply inspection signals to the data lines, and including a first inspection transistor electrically connected between the first data line and a first inspection signal supply line configured to transmit a first inspection signal, a second inspection transistor electrically connected between the second data line and a second inspection signal supply line configured to transmit a second inspection signal, a third inspection transistor electrically connected between the third data line and a third inspection signal supply line configured to transmit a third inspection signal, and a fourth inspection transistor electrically connected between the fourth data line and the second inspection signal supply line, and an element layer above the circuit layer, and including light-emitting elements respectively at the emission areas and electrically connected to the light-emitting pixel drivers.

The first inspection transistor and the third inspection transistor may be configured to be turned on by a first inspection control signal of a first inspection control line, wherein the second inspection transistor is configured to be turned on by a second inspection control signal of a second inspection control line, and wherein the fourth inspection transistor is configured to be turned on by a third inspection control signal of a third inspection control line.

The defect inspection circuit unit may further include a fifth inspection transistor electrically connected between the first data line and a fourth inspection signal supply line configured to transmit a fourth inspection signal, and a sixth inspection transistor electrically connected between the third data line and a fifth inspection signal supply line configured to transmit a fifth inspection signal, wherein the first inspection transistor and the third inspection transistor are configured to be turned on by a first inspection control signal of a first inspection control line, wherein the second inspection transistor is configured to be turned on by a second inspection control signal of a second inspection control line, wherein the fourth inspection transistor is configured to be turned on by a third inspection control signal of a third inspection control line, and wherein the fifth inspection transistor and the sixth inspection transistor are configured to be turned on by a fourth inspection control signal of a fourth inspection control line.

The emission areas may include first emission areas configured to emit light of a first color, second emission areas configured to emit light of a second color corresponding to a wavelength band that is lower than that of the first color, and third emission areas configured to emit light of a third color corresponding to a wavelength band that is lower than that of the second color.

The light-emitting pixel drivers may include first light-emitting pixel drivers electrically connected to the light-emitting elements of the first emission areas, second light-emitting pixel drivers electrically connected to the light-emitting elements of the second emission areas, and third light-emitting pixel drivers electrically connected to the light-emitting elements of the third emission areas, wherein the first light-emitting pixel drivers and the third light-emitting pixel drivers are alternately arranged in the second direction, wherein the second light-emitting pixel drivers are arranged side by side in the second direction, wherein the first data line and the third data line are respectively electrically connected to the first light-emitting pixel drivers and the third light-emitting pixel drivers, and wherein the second data line and the fourth data line are electrically connected to the second light-emitting pixel drivers.

In a first lighting inspection mode for the first emission areas, the defect inspection circuit unit may be configured to transmit, through the first inspection transistor, the first inspection signal to some of the first light-emitting pixel drivers electrically connected to the first data line, and may be configured to transmit, through the third inspection transistor, the third inspection signal to some other first light-emitting pixel drivers electrically connected to the third data line.

In a second lighting inspection mode for the second emission areas, the defect inspection circuit unit may be configured to transmit, through the second inspection transistor, the second inspection signal to some of the second light-emitting pixel drivers electrically connected to the second data line, and may be configured to transmit, through the fourth inspection transistor, the second inspection signal to some other second light-emitting pixel drivers electrically connected to the fourth data line.

In a third lighting inspection mode for the third emission areas, the defect inspection circuit unit may be configured to transmit, through the fifth inspection transistor, the fourth inspection signal to some of the third light-emitting pixel drivers electrically connected to the first data line, and may be configured to transmit, through the sixth inspection transistor, the fifth inspection signal to some other third light-emitting pixel drivers electrically connected to the third data line.

The display device may further include a display-driving circuit configured to supply the data signal, wherein the circuit layer further includes data supply lines at the non-display area, extending to the display-driving circuit, and electrically connecting the data lines and the display-driving circuit, and wherein the data supply lines include a first data supply line electrically connected to the first data line, a second data supply line electrically connected to the second data line, a third data supply line electrically connected to the third data line, and a fourth data supply line electrically connected to the fourth data line.

In a short-circuit inspection mode for detecting whether there is a short circuit between the first data supply line and the fourth data supply line, or whether there is a short circuit between the second data supply line and the third data supply line, the defect inspection circuit unit may be configured to transmit the first inspection signal to the first data line through the first inspection transistor, and may be configured to transmit the second inspection signal to the second data line through the second inspection transistor.

In a short-circuit inspection mode for detecting whether there is a short circuit between the second data supply line and the third data supply line, or whether there is a short circuit between the first data supply line and the fourth data supply line, the defect inspection circuit unit may be configured to transmit the third inspection signal to the third data line through the third inspection transistor, and may be configured to transmit the second inspection signal to the fourth data line through the fourth inspection transistor.

In a short-circuit inspection mode for detecting whether there is a short circuit between the first data supply line and the second data supply line, or whether there is a short circuit between the third data supply line and the fourth data supply line, the defect inspection circuit unit may be configured to transmit the second inspection signal to the second data line through the second inspection transistor, and may be configured to transmit the third inspection signal to the third data line through the third inspection transistor.

In a short-circuit inspection mode for detecting whether there is a short circuit between the first data supply line and the second data supply line, or whether there is a short circuit between the third data supply line and the fourth data supply line, the defect inspection circuit unit may be configured to transmit the first inspection signal to the first data line through the first inspection transistor, and may be configured to transmit the second inspection signal to the fourth data line through the fourth inspection transistor.

The substrate may include a main region including the display area and the non-display area, and a sub-region protruding from one side of the main region, wherein the display-driving circuit is at the sub-region.

According to an aspect of the present disclosure, there is provided a display device including a substrate including a display area in which emission areas are arranged, and a non-display area around the display area, a circuit layer above the substrate, and including light-emitting pixel drivers arranged side by side in a first direction and a second direction, data lines extending in the second direction and configured to transmit a data signal to the light-emitting pixel drivers, and a defect inspection circuit unit at the non-display area, and configured to supply inspection signals to the data lines, operate in a lighting inspection mode for detecting a normal or abnormal status of a light-emitting element for ones of the emission areas of a same color, and operate in a short-circuit inspection mode for detecting a short circuit between neighboring data lines among the data lines, and an element layer above the circuit layer, and including light-emitting elements respectively at the emission areas, and respectively electrically connected to the light-emitting pixel drivers.

The defect inspection circuit unit may include a first inspection transistor electrically connected between a first data line of the data lines and a first inspection signal supply line that may be configured to transmit a first inspection signal, a second inspection transistor electrically connected between a second data line of the data lines and a second inspection signal supply line that may be configured to transmit a second inspection signal, a third inspection transistor electrically connected between a third data line of the data lines and a third inspection signal supply line that may be configured to transmit a third inspection signal, a fourth inspection transistor electrically connected between a fourth data line of the data lines and the second inspection signal supply line, a fifth inspection transistor electrically connected between the first data line and a fourth inspection signal supply line that may be configured to transmit a fourth inspection signal, and a sixth inspection transistor electrically connected between the third data line and a fifth inspection signal supply line that may be configured to transmit a fifth inspection signal, wherein the first inspection transistor and the third inspection transistor are configured to be turned on by a first inspection control signal of a first inspection control line, wherein the second inspection transistor is configured to be turned on by a second inspection control signal of a second inspection control line, wherein the fourth inspection transistor is configured to be turned on by a third inspection control signal of a third inspection control line, and wherein the fifth inspection transistor and the sixth inspection transistor are configured to be turned on by a fourth inspection control signal of a fourth inspection control line.

The emission areas may include first emission areas configured to emit light of a first color, second emission areas configured to emit light of a second color corresponding to a wavelength band that is lower than that of the first color, and third emission areas configured to emit light of a third color corresponding to a wavelength band that is lower than that of the second color, wherein the light-emitting pixel drivers include first light-emitting pixel drivers electrically connected to the light-emitting elements of the first emission areas, second light-emitting pixel drivers electrically connected to the light-emitting elements of the second emission areas, and third light-emitting pixel drivers electrically connected to the light-emitting elements of the third emission areas, wherein the first light-emitting pixel drivers and the third light-emitting pixel drivers are alternately arranged in the second direction, wherein the second light-emitting pixel drivers are arranged side by side in the second direction, wherein the first data line, the second data line, the third data line, and the fourth data line are arranged adjacent to each other in the first direction, wherein the first data line and the third data line are respectively electrically connected to the first light-emitting pixel drivers and the third light-emitting pixel drivers, and wherein the second data line and the fourth data line are electrically connected to the second light-emitting pixel drivers.

In a first lighting inspection mode for the first emission areas, the defect inspection circuit unit may be configured to transmit, through the first inspection transistor, the first inspection signal of the first inspection signal supply line to some of the first light-emitting pixel drivers electrically connected to the first data line, and may be configured to transmit, through the third inspection transistor, the third inspection signal of the third inspection signal supply line to some other first light-emitting pixel drivers electrically connected to the third data line, wherein, in a second lighting inspection mode for the second emission areas, the defect inspection circuit unit may be configured to transmit, through the second inspection transistor, the second inspection signal of the second inspection signal supply line to some of the second light-emitting pixel drivers electrically connected to the second data line, and may be configured to transmit, through the fourth inspection transistor, the second inspection signal to some other second light-emitting pixel drivers electrically connected to the fourth data line, and wherein, in a third lighting inspection mode for the third emission areas, the defect inspection circuit unit may be configured to transmit, through the fifth inspection transistor, the fourth inspection signal of the fourth inspection signal supply line to some of the third light-emitting pixel drivers electrically connected to the first data line, and may be configured to transmit, through the sixth inspection transistor, the fifth inspection signal of the fifth inspection signal supply line to some other third light-emitting pixel drivers electrically connected to the third data line.

In a first short-circuit inspection mode for detecting whether there is a short circuit between the first data line and the fourth data line, or whether there is a short circuit between the second data line and the third data line, the defect inspection circuit unit may be configured to transmit one of the first inspection signal and the fourth inspection signal to the first data line, and may be configured to transmit the second inspection signal to one of the second data line and the fourth data line.

In a second short-circuit inspection mode for detecting whether there is a short circuit between the first data line and the second data line, or whether there is a short circuit between the third data line and the fourth data line, the defect inspection circuit unit may be configured to transmit one of the third inspection signal and the fifth inspection signal to the third data line, and may be configured to transmit the second inspection signal to one of the second data line and the fourth data line.

According to an aspect of the present disclosure, there is provided an electronic device including a display device including a substrate including a display area in which emission areas are arranged, and a non-display area around the display area, a circuit layer above the substrate, and including light-emitting pixel drivers arranged side by side in a first direction and a second direction, data lines extending in the second direction, configured to transmit a data signal to the light-emitting pixel drivers, and including a first data line, a second data line, a third data line, and a fourth data line arranged adjacent to each other in the first direction, and a defect inspection circuit unit at the non-display area, and configured to supply inspection signals to the data lines, and including a first inspection transistor electrically connected between the first data line and a first inspection signal supply line configured to transmit a first inspection signal, a second inspection transistor electrically connected between the second data line and a second inspection signal supply line configured to transmit a second inspection signal, a third inspection transistor electrically connected between the third data line and a third inspection signal supply line configured to transmit a third inspection signal, and a fourth inspection transistor electrically connected between the fourth data line and the second inspection signal supply line, and an element layer above the circuit layer, and including light-emitting elements respectively at the emission areas and electrically connected to the light-emitting pixel drivers.

The electronic device may include a smartphone, a television, a monitor, a tablet, an electric vehicle, a mobile phone, a tablet personal computer (PC), a mobile communication terminal, an electronic notebook, an electronic book, a portable multimedia player (PMP), a navigation device, an ultra-mobile PC (UMPC), a laptop computer, a billboard, an Internet of Things (IoT) device, a smartwatch, a watch phone, or a head-mounted display (HMD).

As described above, according to the embodiments, the display device may include the defect inspection circuit unit located in the non-emission area, and the defect inspection circuit unit may include the second inspection transistor and the fourth inspection transistor that are electrically connected to the second data line and the fourth data line and turned on by different inspection control signals. With this configuration, the defect inspection circuit unit may be operated not only in the lighting inspection mode but also in the short-circuit inspection mode.

Accordingly, because the defect inspection circuit unit of the display device according to the embodiments does not need to include an inspection circuit for lighting inspection and an inspection circuit for short-circuit inspection separately, the width of the non-display area may be reduced.

In addition, because each of the data lines is electrically connected to only two inspection transistors of the defect inspection circuit unit, rather than electrically connected to the inspection circuit for lighting inspection and the inspection circuit for short-circuit inspection, the effect of static electricity on the data lines and the non-display area may be comparatively weakened.

Accordingly, the display quality and lifespan of the display device may be improved.

However, aspects according to the embodiments of the present disclosure are not limited to those exemplified above and various other aspects are incorporated herein.

BRIEF DESCRIPTION OF THE DRAWINGS

The above and other aspects of the present disclosure will become more apparent by describing in detail embodiments thereof with reference to the attached drawings, in which:

FIG. 1 is a perspective view illustrating a display device according to embodiments;

FIG. 3 is a cross-sectional view taken along the line A-A' of FIG. 2;

DETAILED DESCRIPTION

Figure 2:
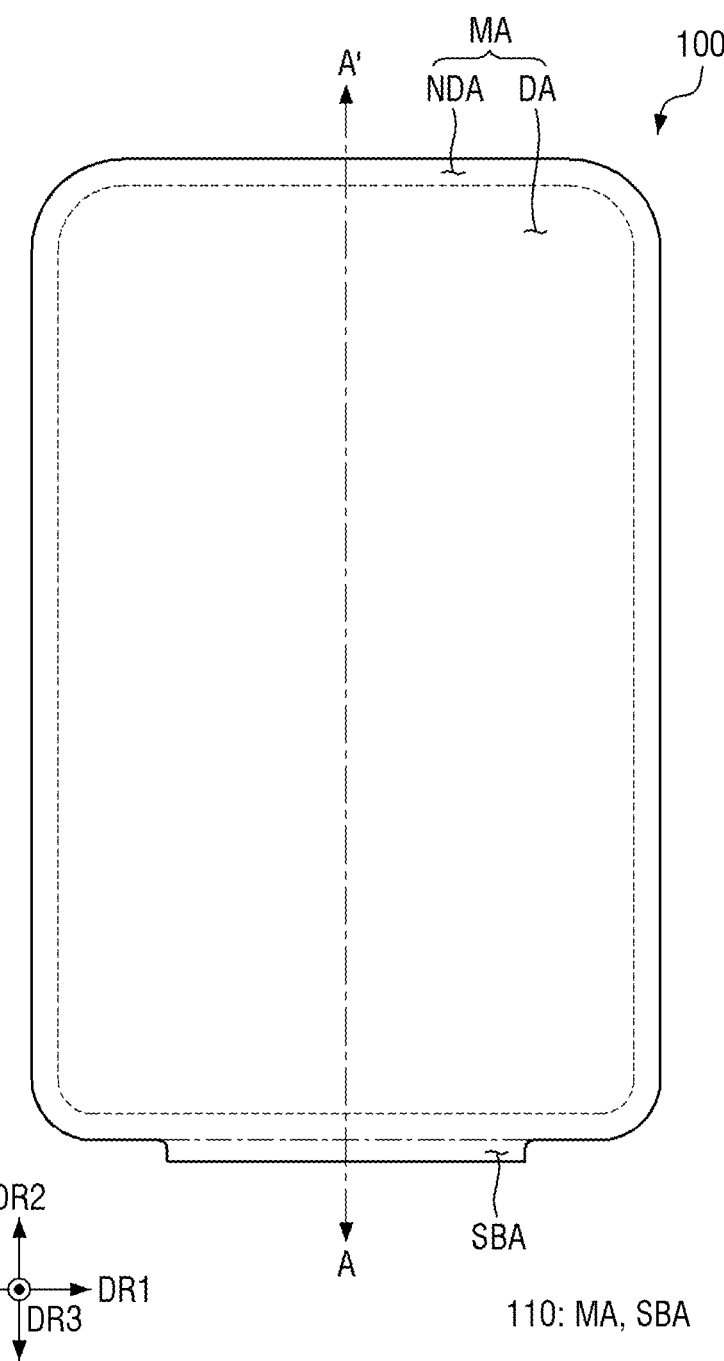
FIG. 2 is a plan view illustrating the display device of FIG. 1.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

Spatially relative terms, such as "beneath," "below," "lower," "lower side," "under," "above," "upper," "over," "higher," "upper side," "side" (e.g., as in "sidewall"), and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component (e.g., an apparatus, a device, a circuit, a wire, an electrode, a terminal, a conductive film, etc.) is referred to as being "formed on," "on," "connected to," or "(operatively, functionally, or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a transistor, a resistor, an inductor, a capacitor, a diode and/or the like. Accordingly, a connection is not limited to the connections illustrated in the drawings or the detailed description and may also include other types of connections. In describing embodiments, an expression of connection indicates electrical connection unless explicitly described to be direct connection, and "directly connected/ directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list. When "C to D" is stated, it means C or more and D or less, unless otherwise specified.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the terms "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." Furthermore, the expression "being the same" may mean "being substantially the same". In other words, the expression "being the same" may include a range that can be tolerated by those of ordinary skill in the art. The other expressions may also be expressions from which "substantially" has been omitted.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
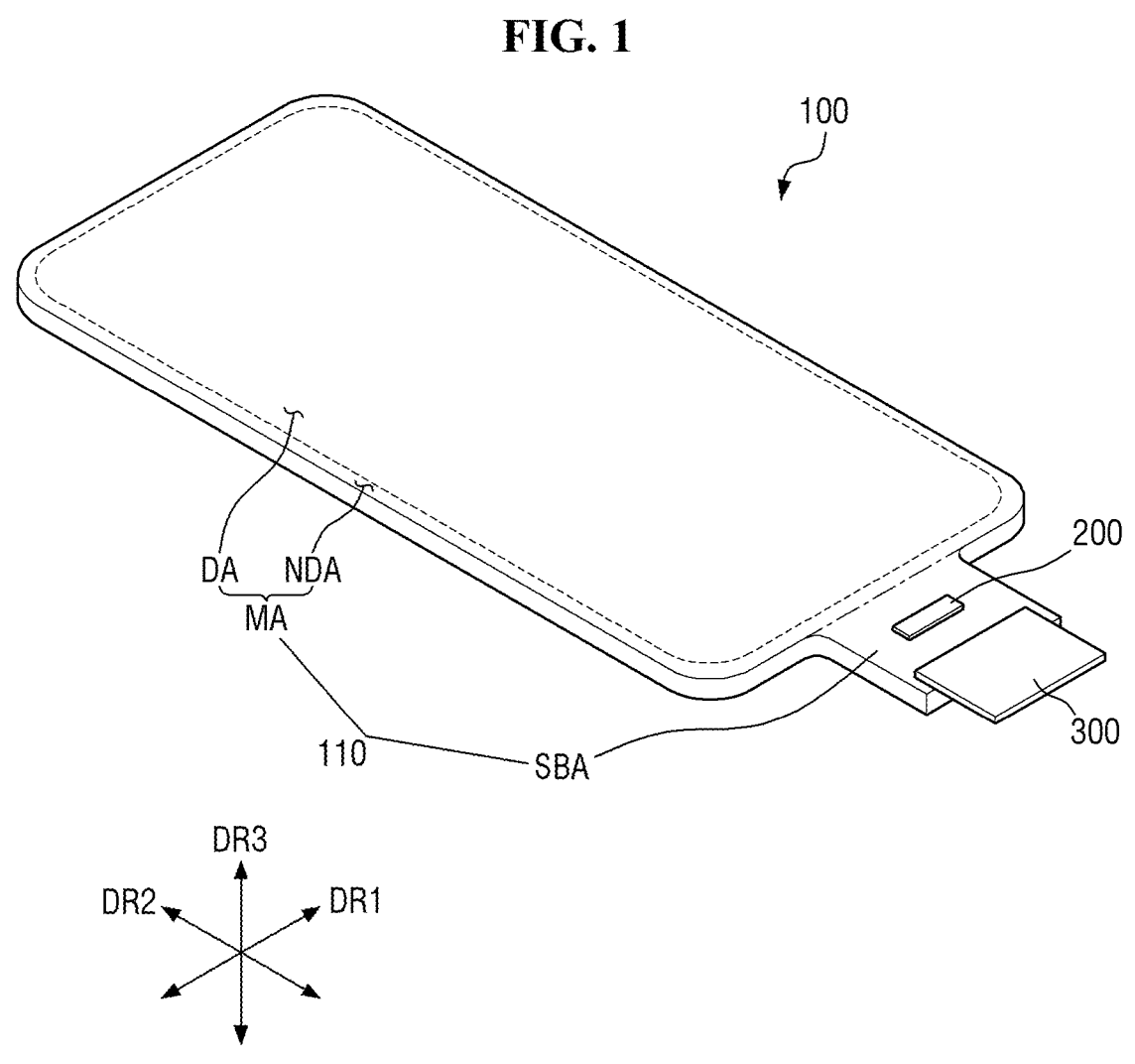
Figure 3:
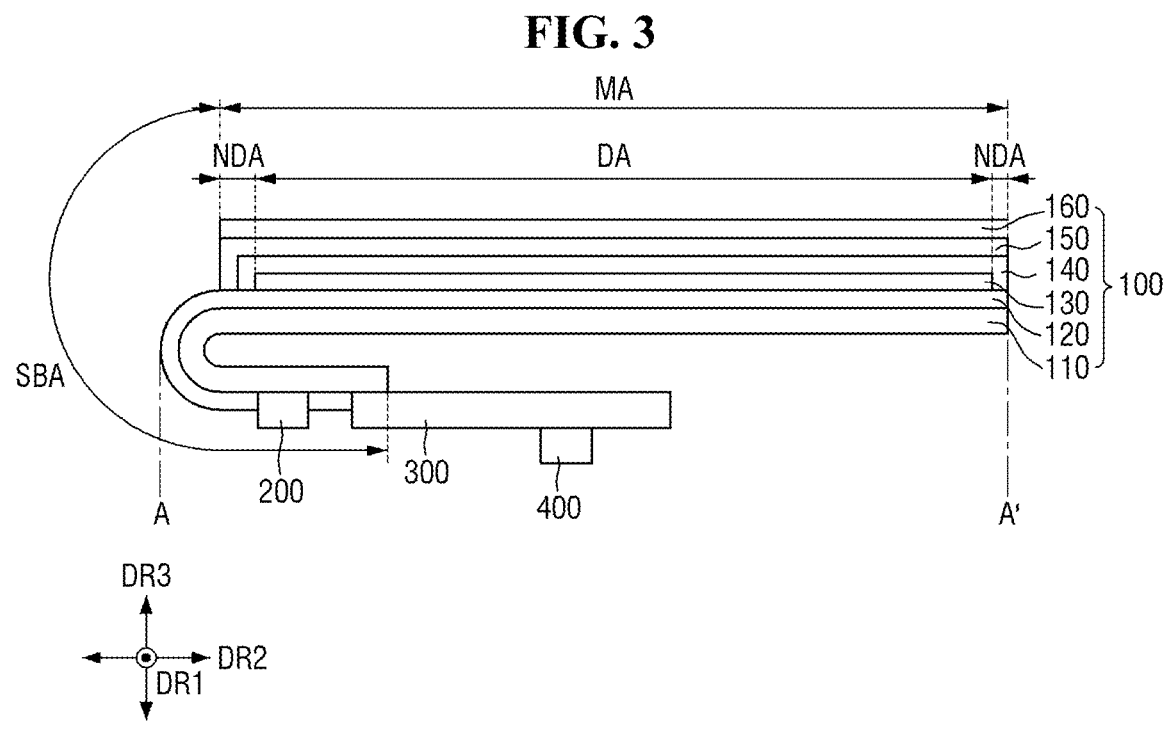

FIG. 1 is a perspective view illustrating a display device according to embodiments. FIG. 2 is a plan view illustrating the display device of FIG. 1. FIG. 3 is a cross-sectional view taken along the line A-A' of FIG. 2.

Referring to FIG. 1, a display device 100, which is a device for displaying a moving image or a still image, may be used as a display screen of various devices, such as a television, a laptop computer, a monitor, a billboard and an Internet-of-Things (IOT) device, as well as portable electronic devices, such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 100 may be a light-emitting display device, such as an organic light-emitting display using an organic light-emitting diode, a quantum dot light-emitting display including a quantum dot light-emitting layer, an inorganic light-emitting display including an inorganic semiconductor, and a micro light-emitting display using a micro or nano light-emitting diode (LED). Hereinafter, a case in which the display device 100 is an organic light-emitting display device will be mainly described, but the present disclosure may be applied to a display device including an organic insulating material, an organic light-emitting material, and a metal material.

The display device 100 may be formed to be flat, but is not limited thereto. For example, the display device 100 may include a curved portion formed at left and right ends and having a constant curvature or a varying curvature. In addition, the display device 100 may be formed to be flexible so that it can be curved, bent, folded, or rolled.

The display device 100 according to one or more embodiments is a device that displays a moving image and/or a still image. The display device 100 may be applied to portable electronic devices such as mobile phones, smartphones, tablet personal computers (PCs), mobile communication terminals, electronic notebooks, electronic books, portable multimedia players (PMPs), navigations, and ultra-mobile PCs (UMPCs). For example, the display device 100 may be applied to a display unit of a television, a laptop computer, a monitor, a billboard, or the Internet of Things (IoT). Alternatively, in one or more embodiments, the display device 100 may be applied to a smartwatch, a watch phone, and/or a head-mounted display device (HMD) for implementing virtual reality and/or augmented reality.

The display device 100 may include a substrate 110, a display-driving circuit 200, and a circuit board 300.

The substrate 110 may include a main region MA located on one surface (hereinafter, referred to as a display surface) where an image is displayed, and a sub-region SBA protruding from one side of the main region MA.

The main region MA may include a display area DA in which emission areas EA (see FIG. 5) emitting light with respective colors and luminances are arranged for displaying an image, and a non-display area NDA located around the display area DA.

A part of the sub-region SBA may be transformed to be bent, so that another part of the sub-region SBA may face the rear surface of the substrate 110, and may overlap the main region MA.

FIG. 1 illustrates a state in which the sub-region SBA is unfolded to be located side by side with the main region MA. On the other hand, FIGS. 2 and 3 illustrate a state in which a part of the sub-region SBA is bent.

Referring to FIG. 2, the display area DA may, in plan view, be formed in a rectangular shape having short sides in a first direction DR1, and having long sides in a second direction DR2 crossing the first direction DR1. The corner where the short side in the first direction DR1 and the long side in the second direction DR2 meet may be rounded to have a curvature (e.g., a predetermined curvature) or may be right-angled. The planar shape of the display area DA is not limited to the rectangular shape, and may be formed in another polygonal shape, a circular shape or an elliptical shape.

The display area DA may occupy most of the main region MA. The display area DA may be generally located at the center of the main region MA.

Referring to FIG. 3, the display device 100 according to embodiments may include the substrate 110 including the display area DA and the non-display area NDA, a circuit layer 120 located on the substrate 110 (as used herein, "located on" may mean "above"), and an element layer 130 located on the circuit layer 120.

The display device 100 according to embodiments may further include an encapsulation layer 140 located on the element layer 130, and a touch sensor layer 150 located on the encapsulation layer 140.

The display device 100 according to embodiments may further include a polarization layer 160 located on the touch sensor layer 150 and overlapping the element layer 130.

The substrate 110 may be formed of an insulating material, such as a polymer resin. For example, the substrate 110 may be formed of polyimide. The substrate 110 may be a flexible substrate which can be bent, folded or rolled. Alternatively, the substrate 110 may be formed of an insulating material, such as glass or the like.

The element layer 130 may include light-emitting elements EMD (see FIG. 6) respectively located in the emission areas EA.

The circuit layer 120 may include light-emitting pixel drivers EPD (see FIGS. 5 and 6) electrically connected to the light-emitting elements EMD of the element layer 130, respectively.

The encapsulation layer 140 may cover the element layer 130, and may extend into the non-display area NDA to be contact with the circuit layer 120. The encapsulation layer 140 may include a structure in which two or more inorganic layers and at least one organic layer are alternately stacked.

The touch sensor layer 150 may be located in the main region MA on the encapsulation layer 140. The touch sensor layer 150 may include touch electrodes for sensing a touch of a person or an object.

The polarization layer 160 blocks external light reflected from the touch sensor layer 150, the encapsulation layer 140, the element layer 130, and the circuit layer 120, and the interfaces thereof, and this is to reduce or prevent deterioration of visibility of an image due to external light reflection.

In one or more embodiments, the display device 100 may further include a cover window located on the polarization layer 160. The cover window may be attached to the polarization layer 160 by a transparent adhesive member, such as an optically clear adhesive (OCA) film or an optically clear resin (OCR). The cover window may be made of an inorganic material, such as glass, or an organic material, such as plastic or a polymer material. Due to the cover window, the touch sensor layer 150, the encapsulation layer 140, the element layer 130, and the circuit layer 120 may be protected from electrical and physical impact on the display surface.

The display-driving circuit 200 may be provided as an integrated circuit (IC) chip.

The display-driving circuit 200 may be mounted on the sub-region SBA of the substrate 110 by a chip-on-glass (COG) method, a chip-on-plastic (COP) method, or an ultrasonic bonding method, but is not limited thereto.

For example, the display-driving circuit 200 may be attached onto the circuit board 300 by a chip-on-film (COF) method.

The display-driving circuit 200 may supply data signals to data lines DL (see FIG. 5) of the circuit layer 120 (see FIG. 3).

The circuit board 300 may be a flexible printed circuit board, a printed circuit board, or a flexible film, such as a chip on film.

The circuit board 300 may be bonded to signal pads SPD (see FIG. 4) located at the edge of the sub-region SBA of the substrate 110 using a low-resistance and high-reliability material, such as an anisotropic conductive film or SAP, and may be electrically connected to the circuit layer 120.

The display device 100 may further include a touch driving circuit 400 for driving the touch sensor layer 150. The touch driving circuit 400 may be prepared as an integrated circuit (IC) chip, and may be mounted on the circuit board 300. The touch driving circuit 400 may apply a touch driving signal to a plurality of driving electrodes provided on the touch sensor layer 150, may receive a touch sensing signal of each of a plurality of touch nodes through a plurality of sensing electrodes, and may sense a charge change amount of mutual capacitance based on the touch sensing signal.

That is, the touch driving circuit 400 may determine whether the user's touch has been made, whether the user is in proximity, and so forth, according to the touch sensing signal of each of the plurality of touch nodes. The user's touch refers to a direct contact of an object, such as a pen or a user's finger with the front surface of the display device 100. The user's approach means that an object, such as a pen or a user's finger is positioned away from the front surface of the display device 100, such as hovering.

Figure 4:
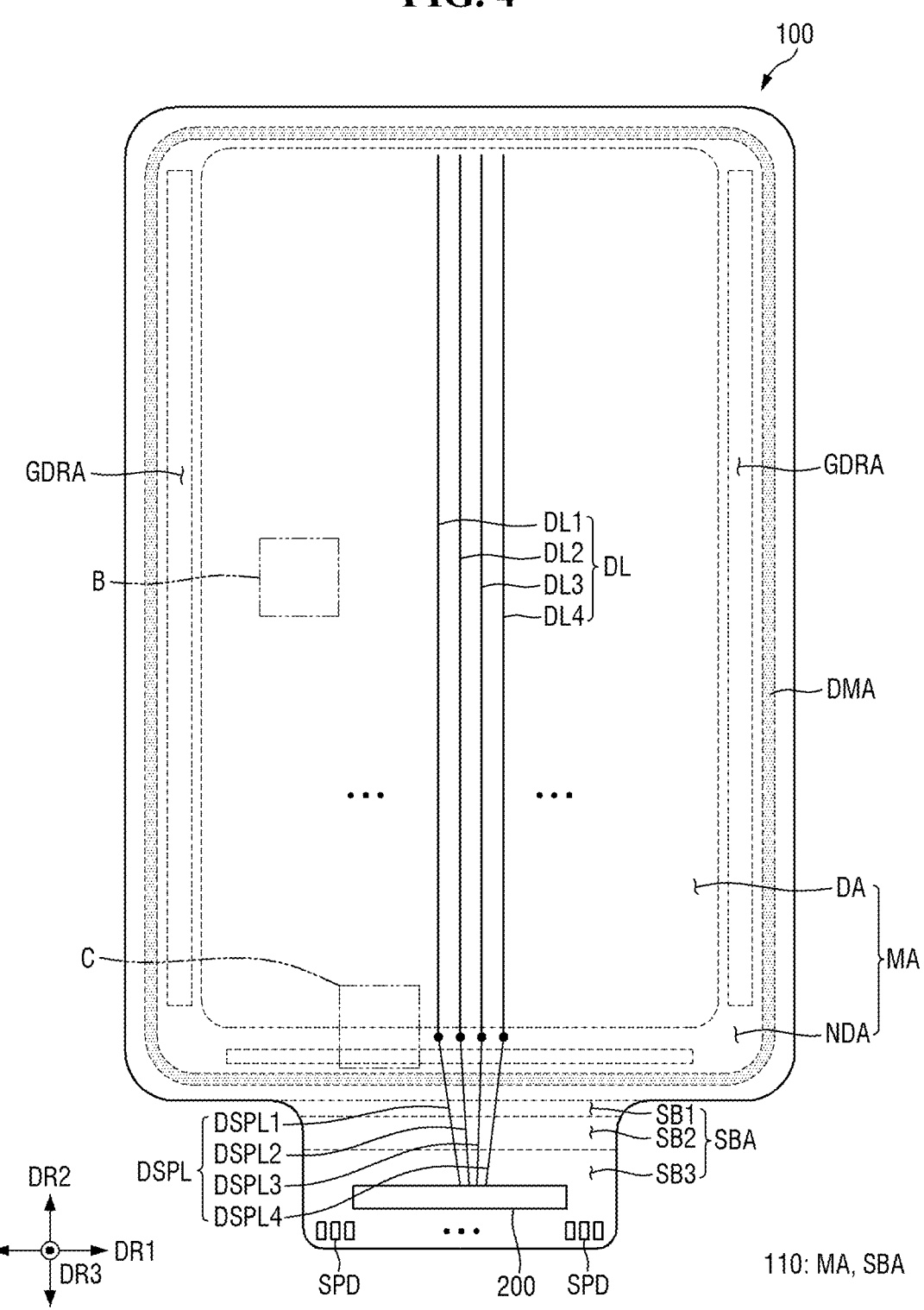
FIG. 4 is a plan view showing the substrate of FIG. 3.

FIG. 4 is a plan view showing the substrate of FIG. 3.

Referring to FIG. 4, the substrate 110 of the display device 100 according to embodiments may include the main region MA corresponding to the display surface, and the sub-region SBA protruding from one side of the main region MA.

The main region MA may include the display area DA in which emission areas EA are arranged, and the non-display area NDA located around the display area DA.

The circuit layer 120 (see FIG. 3) may include data lines DL located in the display area DA, and extending in the second direction DR2.

The data lines DL may include a first data line DL1, a second data line DL2, a third data line DL3, and a fourth data line DL4 arranged adjacent to each other.

The non-display area NDA may include a dam area DMA spaced apart from the display area DA, and surrounding the display area DA (e.g., in plan view).

At least one dam portion surrounding the display area DA may be arranged in the dam area DMA. The at least one dam portion is provided to delimit the diffusion range of an organic insulating material in the encapsulation layer 140. That is, the organic insulating material of the encapsulation layer 140 may be confined to the dam area DMA in which the at least one dam portion is located.

The non-display area NDA may further include a gate-driving circuit area GDRA facing, among the edges of the display area DA, at least one side extending in the second direction DR2.

The circuit layer 120 may be located in the gate-driving circuit area GDRA, and may include a gate-driving circuit configured to supply a signal to gate lines.

The circuit layer 120 (see FIG. 3) may include a defect inspection circuit unit TSTC for detecting whether the circuit layer 120 (see FIG. 3) or the element layer 130 (see FIG. 3) is normal.

The defect inspection circuit unit TSTC may be located in a portion of the non-display area NDA. As an example, the defect inspection circuit unit TSTC may be located in a portion of the non-display area NDA adjacent to the display-driving circuit 200 of the sub-region SBA.

The sub-region SBA may include a bending area BA that is transformed into a bent shape, and a first sub-region SB1 and a second sub-region SB2 that are respectively in contact with both sides of the bending area BA.

The first sub-region SB1 is located between the main region MA and the bending area BA. One side of the first sub-region SB1 may be in contact with the non-display area NDA of the main region MA, and the other side of the first sub-region SB1 may be in contact with the bending area BA.

The second sub-region SB2 is spaced apart from the main region MA with the bending area BA interposed therebetween, and is located on (e.g., below) the bottom surface of the substrate 110 by the bending area BA being transformed to be bent. That is, the second sub-region SB2 may overlap the main region MA in a thickness direction DR3 of the substrate 110 due to the bending area BA transformed to be bent.

One side of the second sub-region SB2 may be in contact with the bending area BA. The other side of the second sub-region SB2 may be in contact with a part of the edge of the substrate 110.

The signal pads SPD to which the circuit board 300 is connected, and the display-driving circuit 200, may be located in the second sub-region SB2.

The circuit layer (120 of FIG. 3) may further include data supply lines DSPL electrically connected between the data lines DL and the display-driving circuit 200.

The data supply lines DSPL may be located in the non-display area NDA, and may extend to the display-driving circuit 200 in the sub-region SBA. The data supply lines DSPL may include a first data supply line DSPL1 electrically connected to the first data line DL1, a second data supply line DSPL2 electrically connected to the second data line DL2, a third data supply line DSPL3 electrically connected to the third data line DL3, and a fourth data supply line DSPL4 electrically connected to the fourth data line DL4.

Figure 5:
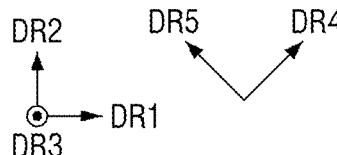
FIG. 5 is a layout diagram illustrating part B of FIG. 4.

FIG. 5 is a layout diagram illustrating part B of FIG. 4.

Referring to FIG. 5, the display area DA of the substrate 110 of the display device 100 according to embodiments may include the emission areas EA. In addition, the display area DA may further include a non-emission area located in a gap between the emission areas EA.

The light-emitting pixel drivers EPD that are respectively electrically connected to the light-emitting elements EMD of the emission areas EA may be arranged side by side in the main region MA in the first direction DR1 and the second direction DR2. The light-emitting pixel drivers EPD may be respectively electrically connected to light-emitting elements EMD (see FIG. 6) of the element layer 130 (see FIG. 3) respectively located in the emission areas EA.

The emission areas EA may have a rhombus shape or a rectangular shape in plan view. However, this is only an example, and the planar shape of the emission areas EA according to one or more embodiments is not limited to that illustrated in FIG. 5. That is, in plan view, the emission areas EA may have a polygonal shape, such as a quadrangle, a pentagon, and a hexagon, or may have a circular or elliptical shape including the edge of a curve.

The emission areas EA may include first emission areas EA1 for emitting light of a first color in a wavelength band (e.g., predetermined wavelength band), second emission areas EA2 for emitting light of a second color in a wavelength band lower than that of the first color, and third emission areas EA3 for emitting light of a third color in a wavelength band lower than that of the second color.

For example, the first color may be red having a wavelength band of approximately 600 nm to approximately 750 nm. The second color may be green having a wavelength band of approximately 480 nm to approximately 560 nm. The third color may be blue having a wavelength band of approximately 370 nm to approximately 460 nm.

The first emission areas EA1 and the third emission areas EA3 may be alternately located in at least one of the first direction DR1 or the second direction DR2.

The second emission areas EA2 may be arranged side by side with each other in at least one of the first direction DR1 or the second direction DR2.

In addition, the second emission areas EA2 may be adjacent to the first emission areas EA1 and the third emission areas EA3 in diagonal directions DR4 and DR5 crossing the first direction DR1 and the second direction DR2.

Pixels PX displaying their own luminances and colors may be provided by the first emission area EA1, the second emission area EA2, and the third emission area EA3 adjacent to each other among these emission areas EA.

In other words, the pixel PX may be a basic unit for displaying various colors including white with a luminance (e.g., predetermined luminance).

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

Figure 6:
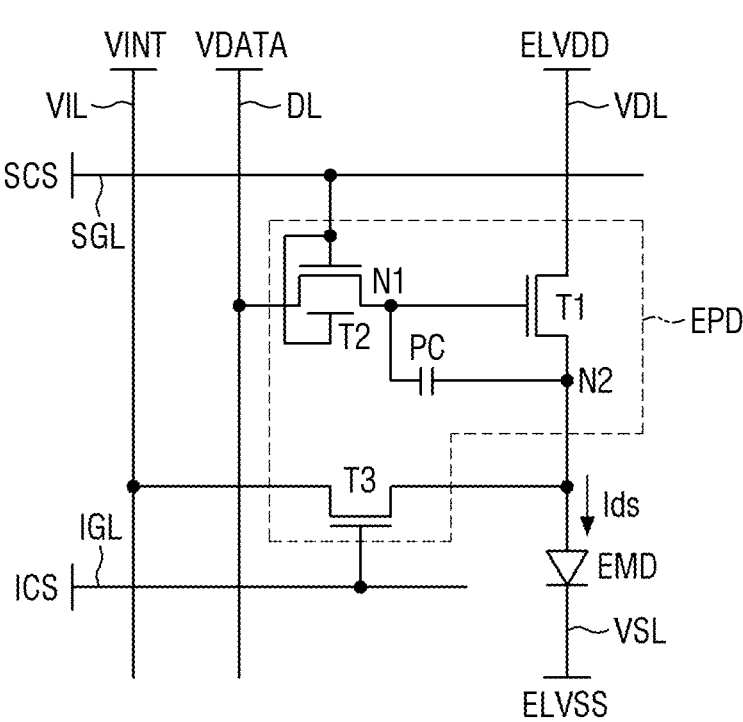
FIG. 6 is an equivalent circuit diagram showing the light-emitting pixel driver of FIG. 5.

FIG. 6 is an equivalent circuit diagram showing the light-emitting pixel driver of FIG. 5.

Referring to FIG. 6, the circuit layer 120 (see FIG. 3) of the display device 100 according to embodiments may include a first power line VDL and a second power line VSL that respectively transmit voltages of a first power source ELVDD and a second power source ELVSS for driving the light-emitting elements EMD. The second power source ELVSS may be at a voltage level that is lower than that of the first power source ELVDD.

The circuit layer 120 (see FIG. 3) may include a scan gate line SGL that transmits a scan signal SCS, and an initialization control line IGL that transmits an initialization control signal ICS. The circuit layer 120 may further include an initialization voltage line VIL that transmits an initialization voltage VINT.

Referring to FIG. 6, one of the light-emitting elements EMD of the element layer 130 may be electrically connected between one of the light-emitting pixel drivers EPD of the circuit layer 120 and the second power source ELVSS.

One of the light-emitting pixel drivers EPD of the circuit layer 120 may include a first transistor T1 configured to generate a driving current for driving the light-emitting element EMD, and at least one pixel capacitor PC and two or more transistors T2 and T3 electrically connected to the first transistor T1.

The first transistor T1 may be electrically connected between the first power line VDL and one light-emitting element EMD. The gate electrode of the first transistor T1 may be electrically connected to a first node N1.

The pixel capacitor PC may be electrically connected between the first node N1 and a second node N2. The first node N1 is electrically connected to the gate electrode of the first transistor T1. The second node N2 may be electrically connected to the second electrode (e.g., the drain electrode) of the first transistor T1 and the anode electrode of the light-emitting element EMD.

The second transistor T2 may be electrically connected between the data line DL transmitting a data signal VDATA and the first node N1. The second transistor T2 may be turned on by the scan signal SCS of the scan gate line SGL.

That is, through the second transistor T2 turned on by the scan signal SCS, the data signal VDATA of the data line DL may be transmitted to the first node N1. At this time, if the voltage difference between the first node N1 and the second node N2 becomes greater than the threshold voltage of the first transistor T1 due to the data signal VDATA, the first transistor T1 is turned on, so that a current Ids between the source electrode and the drain electrode of the first transistor T1 may be supplied as the driving current of the light-emitting element EMD. Because the magnitude of the current Ids between the source electrode and the drain electrode of the first transistor T1 corresponds to the data signal VDATA, the light-emitting element EMD may emit light with luminance corresponding to the data signal VDATA.

The third transistor T3 may be electrically connected between the initialization voltage line VIL transmitting the initialization voltage VINT and the second node N2. The third transistor T3 may be turned on by the initialization control signal ICS of the initialization control line IGL. Accordingly, through the turned-on third transistor T3, the potential of the second node N2 may be initialized to the initialization voltage VINT of the initialization voltage line VIL.

Meanwhile, although FIG. 6 shows a case in which the light-emitting pixel driver EPD includes three N-type MOSFETs and one pixel capacitor, the light-emitting pixel drivers EPD of the circuit layer 120 according to embodiments are not limited to the example shown in FIG. 6.

Figure 7:
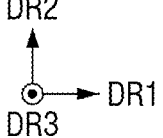
FIG. 7 is a layout diagram showing part C of FIG. 4 according to embodiments.

FIG. 7 is a layout diagram showing part C of FIG. 4 according to embodiments.

Referring to FIG. 7, the circuit layer 120 of the display device 100 according to embodiments may include the light-emitting pixel drivers EPD arranged in the first direction DR1 and the second direction DR2, the data lines DL extending in the second direction DR2, and the defect inspection circuit unit TSTC located in the non-display area NDA.

The light-emitting pixel drivers EPD may be respectively electrically connected to the light-emitting elements EMD of the element layer 130 (see FIG. 3). The light-emitting pixel drivers EPD may include first light-emitting pixel drivers EPD1 electrically connected to the light-emitting elements EMD (see FIG. 6) of the first emission areas EA1 (see FIG. 5), second light-emitting pixel drivers EPD2 electrically connected to the light-emitting elements EMD (see FIG. 6) of the second emission areas EA2 (see FIG. 5), and third light-emitting pixel drivers EPD3 electrically connected to the light-emitting elements EMD (see FIG. 6) of the third emission areas EA3 (see FIG. 5).

According to one or more embodiments, as shown in FIG. 7, the first light-emitting pixel drivers EPD1 and the third light-emitting pixel drivers EPD3 may be alternately arranged in the second direction DR2.

The second light-emitting pixel drivers EPD2 may be arranged side by side in the second direction DR2.

The data lines DL may transmit the data signal VDATA (see FIG. 6) to the light-emitting pixel drivers EPD. The data lines DL may include the first data line DL1, the second data line DL2, the third data line DL3, and the fourth data line DL4 arranged adjacent to each other.

Each of the first data line DL1 and the third data line DL3 may be electrically connected to respective first light-emitting pixel drivers EPD1 and third light-emitting pixel drivers EPD3.

Each of the second data line DL2 and the fourth data line DL4 may be electrically connected to respective second light-emitting pixel drivers EPD2.

The circuit layer 120 may further include data supply lines DSPL electrically connected between the data lines DL and the display-driving circuit 200 (see FIGS. 1, 3, and 5) that supplies the data signal VDATA (see FIG. 6).

The data supply lines DSPL may include the first data supply line DSPL1 electrically connected to the first data line DL1, the second data supply line DSPL2 electrically connected to the second data line DL2, the third data supply line DSPL3 electrically connected to the third data line DL3, and the fourth data supply line DSPL4 electrically connected to the fourth data line DL4.

The defect inspection circuit unit TSTC may be electrically connected to the data lines DL through the data supply lines DSPL. The defect inspection circuit unit TSTC may supply inspection signals to the data lines DL.

Figure 8:
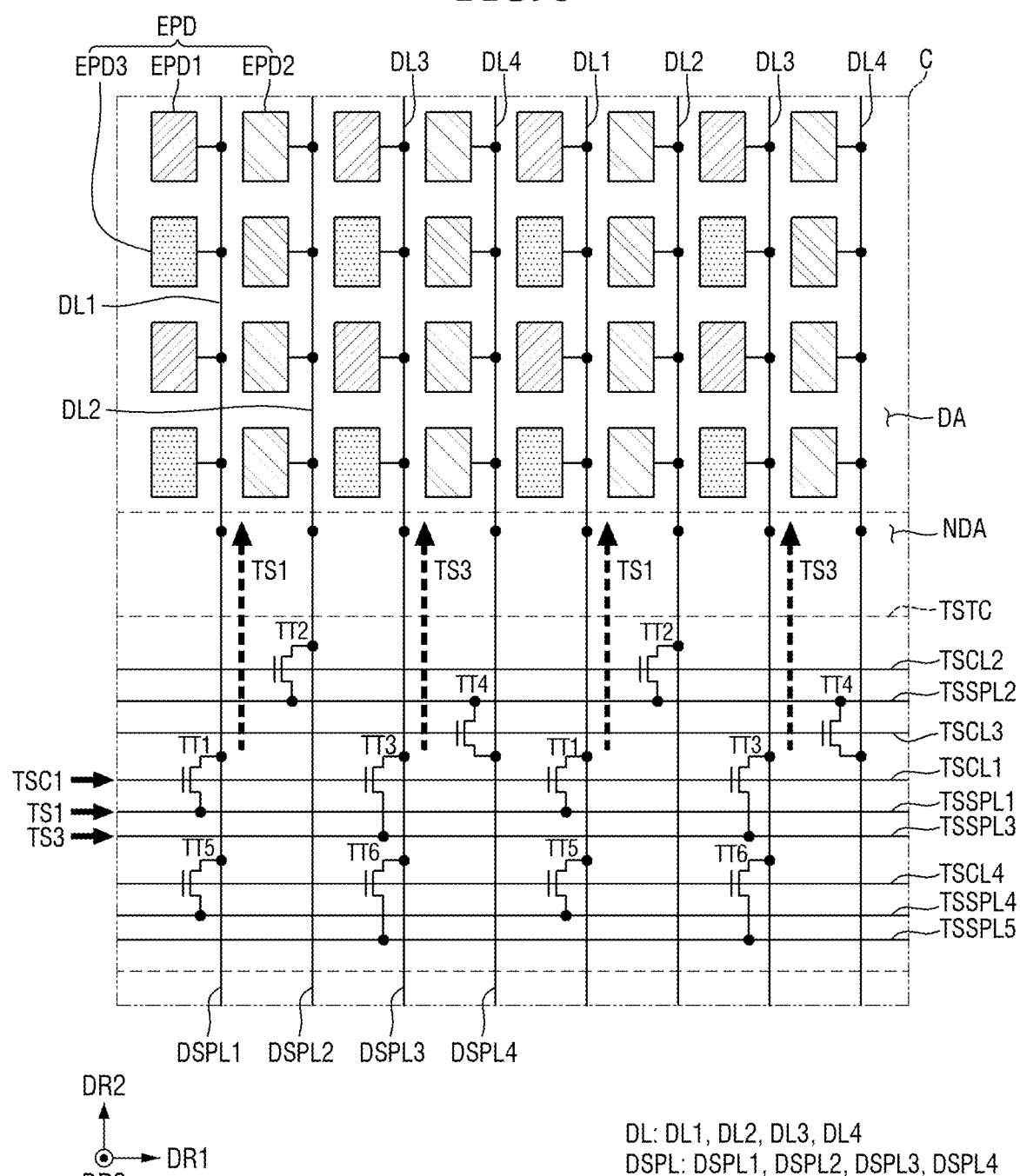
FIGS. 8, 9 and 10 are layout diagrams showing an operation of the defect inspection circuit unit in the lighting inspection mode according to embodiments.

According to one or more embodiments, the defect inspection circuit unit TSTC may include a first inspection transistor TT1 electrically connected between the first data line DL1 and a first inspection signal supply line TSSPL1 that supplies a first inspection signal TS1 (see FIG. 8). A second inspection transistor TT2 electrically connected between the second data line DL2 and a second inspection signal supply line TSSPL2 that supplies a second inspection signal TS2 (see FIG. 9). A third inspection transistor TT3 electrically connected between the third data line DL3 and a third inspection signal supply line TSSPL3 that supplies a third inspection signal TS3 (see FIG. 8). A fourth inspection transistor TT4 electrically connected between the second inspection signal supply line TSSPL2 and the fourth data line DL4.

The first inspection transistor TT1 and the third inspection transistor TT3 may be turned on by a first inspection control signal TSC1 (see FIG. 8) of a first inspection control line TSCL1.

The second inspection transistor TT2 may be turned on by a second inspection control signal TSC2 (see FIG. 9) of a second inspection control line TSCL2.

The fourth inspection transistor TT4 may be turned on by a third inspection control signal TSC3 (see FIG. 9) of a third inspection control line TSCL3.

As described above, the defect inspection circuit unit TSTC of the display device 100 according to embodiments includes the second inspection transistor TT2 and the fourth inspection transistor TT4 respectively electrically connected between the second inspection signal supply line TSSPL2 and a respective one of the second data line DL2 and the fourth data line DL4 corresponding to the second light-emitting pixel drivers EPD2. The second inspection transistor TT2 and the fourth inspection transistor TT4 are respectively turned on by the second inspection control signal TSC2 (see FIG. 9) and the third inspection control signal TSC3 (see FIG. 9), which are different from each other.

Thus, the defect inspection circuit unit TSTC according to embodiments may be operated in a short-circuit inspection mode for detecting whether there is a short circuit between the neighboring data lines DL among the data lines DL, or whether there is a short circuit between the neighboring data supply lines DSPL among the data supply lines DSPL.

In addition, the defect inspection circuit unit TSTC according to embodiments may transmit the first inspection signal TS1 (see FIG. 8) and the third inspection signal TS3 (see FIG. 8) to the first data line DL1 and the third data line DL3 through the first inspection transistor TT1 and the third inspection transistor TT3. Therefore, by means of the defect inspection circuit unit TSTC, first lighting inspection may be performed to detect whether the light-emitting elements EMD (see FIG. 6) of the first emission areas EA1 (see FIG. 5), which are electrically connected to the first light-emitting pixel drivers EPD1, are normal.

Further, the defect inspection circuit unit TSTC according to embodiments may transmit the second inspection signal TS2 (see FIG. 9) to the second data line DL2 and the fourth data line DL4 respectively through the second inspection transistor TT2 and the fourth inspection transistor TT4. Therefore, by means of the defect inspection circuit unit TSTC, second lighting inspection may be performed to detect whether the light-emitting elements EMD (see FIG. 6) of the second emission areas EA2 (FIG. 5), which are electrically connected to the second light-emitting pixel drivers EPD2, are normal.

Figure 10:
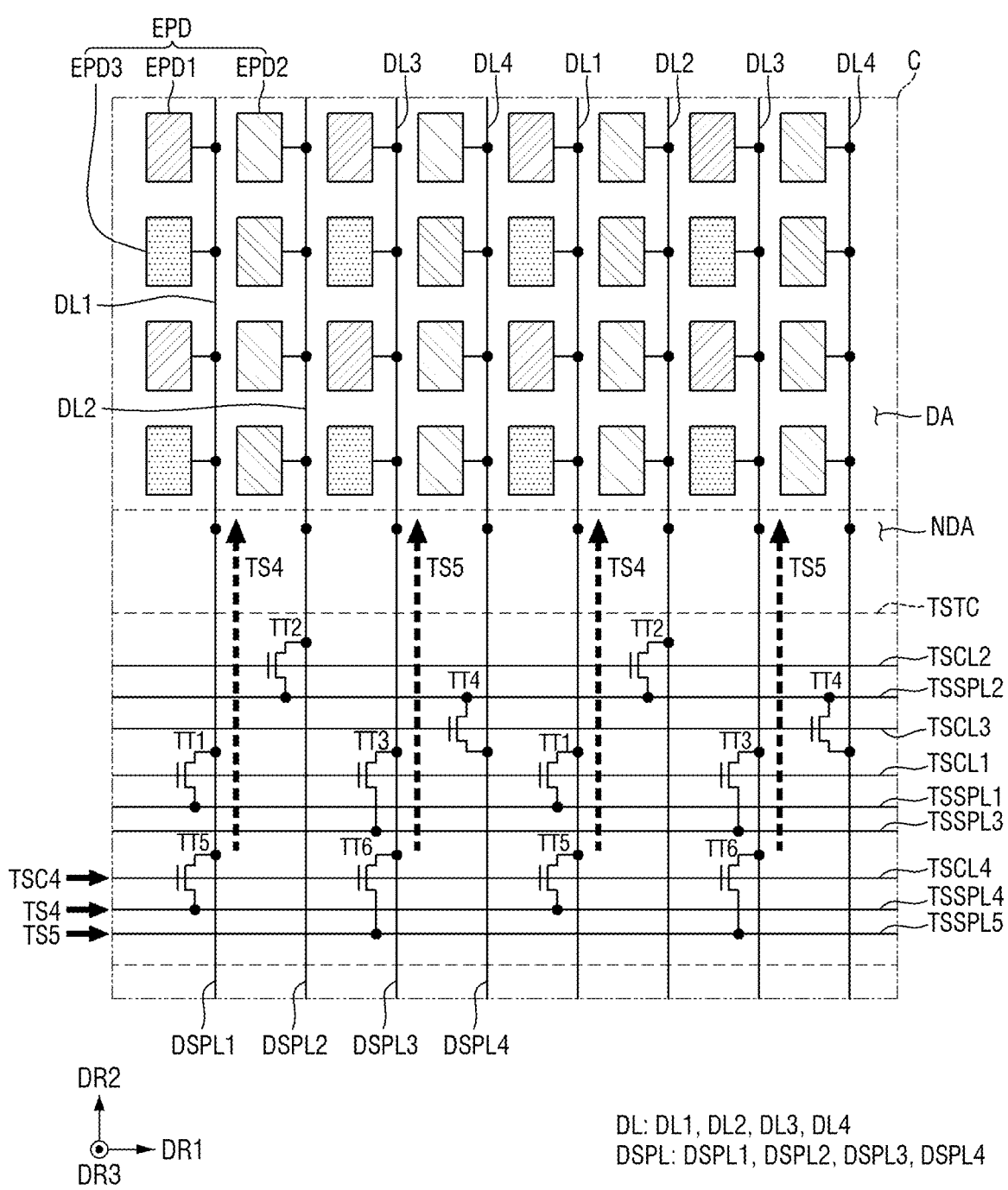

Alternatively, according to one or more other embodiments, the defect inspection circuit unit TSTC may further include a fifth inspection transistor TT5 electrically connected between the first data line DL1 and a fourth inspection signal supply line TSSPL4 that supplies a fourth inspection signal TS4 (see FIG. 10), and a sixth inspection transistor TT6 electrically connected between the third data line DL3 and a fifth inspection signal supply line TSSPL5 that supplies a fifth inspection signal TS5 (see FIG. 10).

The fifth inspection transistor TT5 and the sixth inspection transistor TT6 may be turned on by a fourth inspection control signal TSC4 (see FIG. 10) of a fourth inspection control line TSCL4.

Thus, the defect inspection circuit unit TSTC according to embodiments may transmit the fourth inspection signal TS4 (see FIG. 10) and the fifth inspection signal TS5 (see FIG. 10) to the first data line DL1 and the third data line DL3 through the fifth inspection transistor TT5 and the sixth inspection transistor TT6, respectively. Therefore, by means of the defect inspection circuit unit TSTC, third lighting inspection may be performed to detect whether the light-emitting elements EMD (see FIG. 6) of the third emission areas EA3 (see FIG. 5) electrically connected to the third light-emitting pixel drivers EPD3 are normal.

In other words, the defect inspection circuit unit TSTC according to embodiments may operate in one of a lighting inspection mode for detecting a normal or abnormal status of the light-emitting element EMD (see FIG. 6) for each of the emission areas EA1 (EA2, EA3) of the same color among the emission areas EA (see FIG. 5), and a short-circuit inspection mode for detecting a short circuit between the neighboring data lines DL among the data lines DL.

Figure 9:
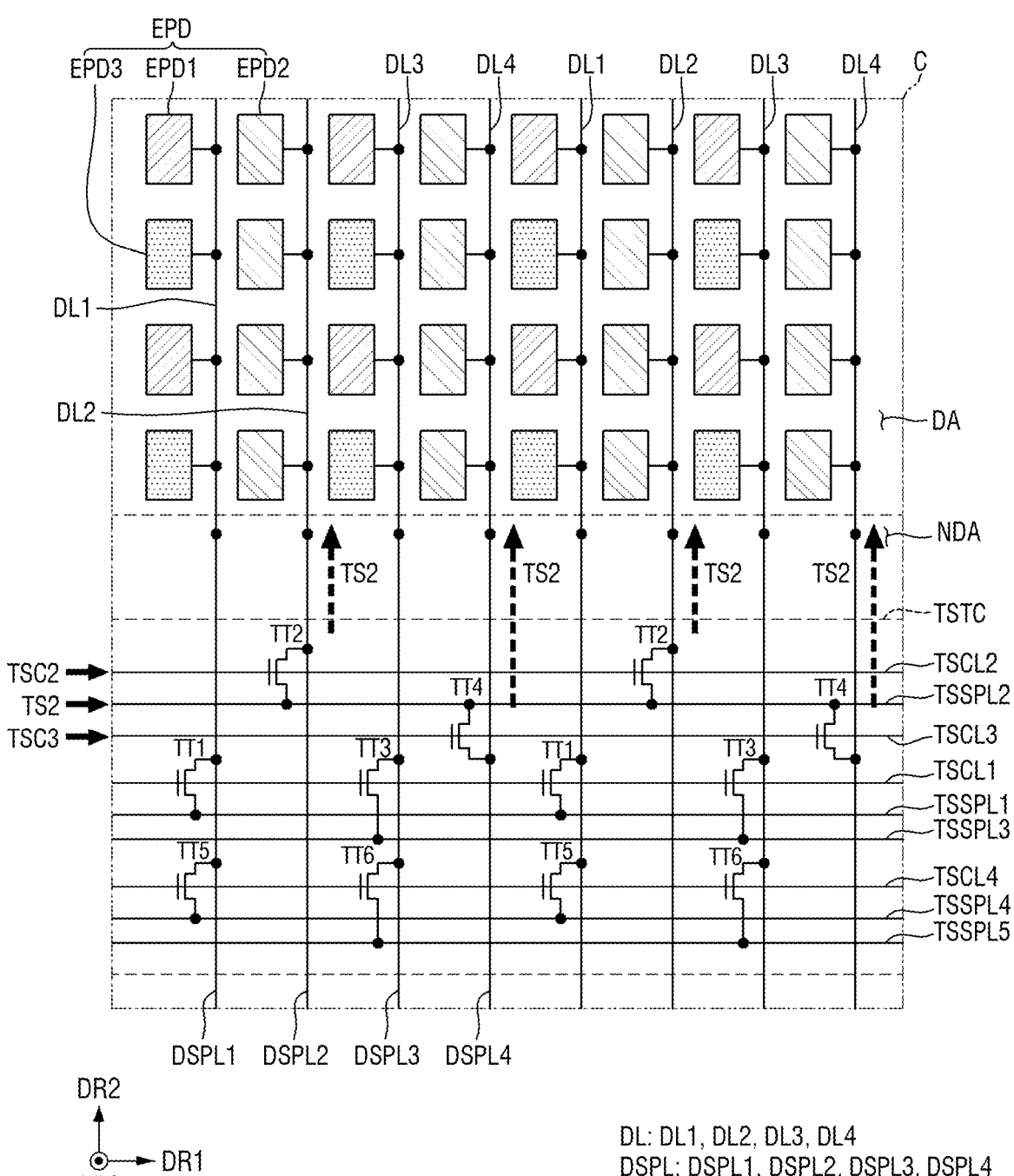

FIGS. 8, 9, and 10 are layout diagrams showing an operation of the defect inspection circuit unit in the lighting inspection mode according to embodiments.

Referring to FIG. 8, in a first lighting inspection mode for the first emission areas EA1 (see FIG. 5), the first inspection control line TSCL1 may transmit the first inspection control signal TSC1, and the first inspection signal supply line TSSPL1 and the third inspection signal supply line TSSPL3 may respectively transmit the first inspection signal TS1 and the third inspection signal TS3.

Accordingly, in response to the first inspection control signal TSC1, the first inspection transistor TT1 and the third inspection transistor TT3 may be turned on. Then, through the turned-on first inspection transistor TT1, the first inspection signal TS1 may be transmitted to the first data line DL1, and through the turned-on third inspection transistor TT3, the third inspection signal TS3 may be transmitted to the third data line DL3.

Thus, in the first lighting inspection mode, the defect inspection circuit unit TSTC may transmit, through the first inspection transistor TT1, the first inspection signal TS1 to some of the first light-emitting pixel drivers EPD1 electrically connected to the first data line DL1, and may transmit, through the third inspection transistor TT3, the third inspection signal TS3 to some other first light-emitting pixel drivers EPD1 electrically connected to the third data line DL3.

In this way, by means of the defect inspection circuit unit TSTC of the first lighting inspection mode, the light-emitting elements EMD (see FIG. 6) of the first emission areas EA1 (see FIG. 5) may emit light by a driving current by one of the first inspection signal TS1 and the third inspection signal TS3.

Referring to FIG. 9, in a second lighting inspection mode for the second emission areas EA2 (see FIG. 5), the second inspection control line TSCL2 may transmit the second inspection control signal TSC2, the third inspection control line TSCL3 may transmit the third inspection control signal TSC3, and the second inspection signal supply line TSSPL2 may transmit the second inspection signal TS2.

Accordingly, the second inspection transistor TT2 may be turned on by the second inspection control signal TSC2, and the fourth inspection transistor TT4 may be turned on by the third inspection control signal TSC3. Then, through the turned-on second inspection transistor TT2, the second inspection signal TS2 may be transmitted to the second data line DL2, and through the turned-on fourth inspection tran-sistor TT4, the second inspection signal TS2 may be trans-mitted to the fourth data line DL4.

Thus, in the second lighting inspection mode, the defect inspection circuit unit TSTC may transmit, through the second inspection transistor TT2, the second inspection signal TS2 to some of the second light-emitting pixel drivers EPD2 electrically connected to the second data line DL2, and may transmit, through the fourth inspection transistor TT4, the second inspection signal TS2 to some other second light-emitting pixel drivers EPD2 electrically connected to the fourth data line DL4.

In this way, by means of the defect inspection circuit unit TSTC of the second lighting inspection mode, the light-emitting elements EMD (see FIG. 6) of the second emission areas EA2 (see FIG. 5) may emit light by a driving current by the second inspection signal TS2.

Referring to FIG. 10, in a third lighting inspection mode for the third emission areas EA3 (see FIG. 5), the fourth inspection control line TSCL4 may transmit the fourth inspection control signal TSC4, and the fourth inspection signal supply line TSSPL4 and the fifth inspection signal supply line TSSPL5 may transmit the fourth inspection signal TS4 and the fifth inspection signal TS5, respectively.

Accordingly, the fifth inspection transistor TT5 and the sixth inspection transistor TT6 may be turned on by the fourth inspection control signal TSC4. Then, through the turned-on fifth inspection transistor TT5, the fourth inspec-tion signal TS4 may be transmitted to the first data line DL1, and through the turned-on sixth inspection transistor TT6, the fifth inspection signal TS5 may be transmitted to the third data line DL3.

Thus, in the third lighting inspection mode, the defect inspection circuit unit TSTC may transmit, through the fifth inspection transistor TT5, the fourth inspection signal TS4 to some of the third light-emitting pixel drivers EPD3 electri-cally connected to the first data line DL1, and may transmit, through the sixth inspection transistor TT6, the fifth inspec-tion signal TS5 to some other third light-emitting pixel drivers EPD3 electrically connected to the third data line DL3.

In this way, by means of the defect inspection circuit unit TSTC of the third lighting inspection mode, the light-emitting elements EMD (see FIG. 6) of the third emission areas EA3 (see FIG. 5) may emit light by a driving current by one of the fourth inspection signal TS4 and the fifth inspection signal TS5.

FIGS. 11, 12, 13, 14, 15, 16, 17, and 18 are layout diagrams showing the operation of the defect inspection circuit unit in the short-circuit inspection mode.

The defect inspection circuit unit TSTC of the display device 100 according to embodiments may operate in the short-circuit inspection mode for detecting a short circuit between the neighboring data lines DL among the data lines DL, that is, a short circuit between the neighboring data supply lines DSPL among the data supply lines DSPL.

As the data supply lines DSPL are arranged in the non-display area NDA of a limited width, a short-circuit defect between the neighboring data supply lines DSPL may be easily caused due to high resolution or the like.

The short-circuit inspection mode for detecting this short circuit may involve the processes of supplying an inspection signal to one of the neighboring data lines DL, and detecting whether a light-emitting element electrically connected to another data line DL emits light together.

That is, in a first short-circuit inspection mode for detect-ing whether there is a short circuit between the first data supply line DSPL1 and the fourth data supply line DSPL4, or whether there is a short circuit between the second data supply line DSPL2 and the third data supply line DSPL3, the defect inspection circuit unit TSTC may transmit the inspection signal to the first data line DL1 and the second data line DL2, or to the third data line DL3 and the fourth data line DL4.

Further, in a second short-circuit inspection mode for detecting whether there is a short circuit between the first data supply line DSPL1 and the second data supply line DSPL2, or whether there is a short circuit between the third data supply line DSPL3 and the fourth data supply line DSPL4, the defect inspection circuit unit TSTC may transmit the inspection signal to the second data line DL2 and the third data line DL3, or to the first data line DL1 and the fourth data line DL4.

Figure 11:
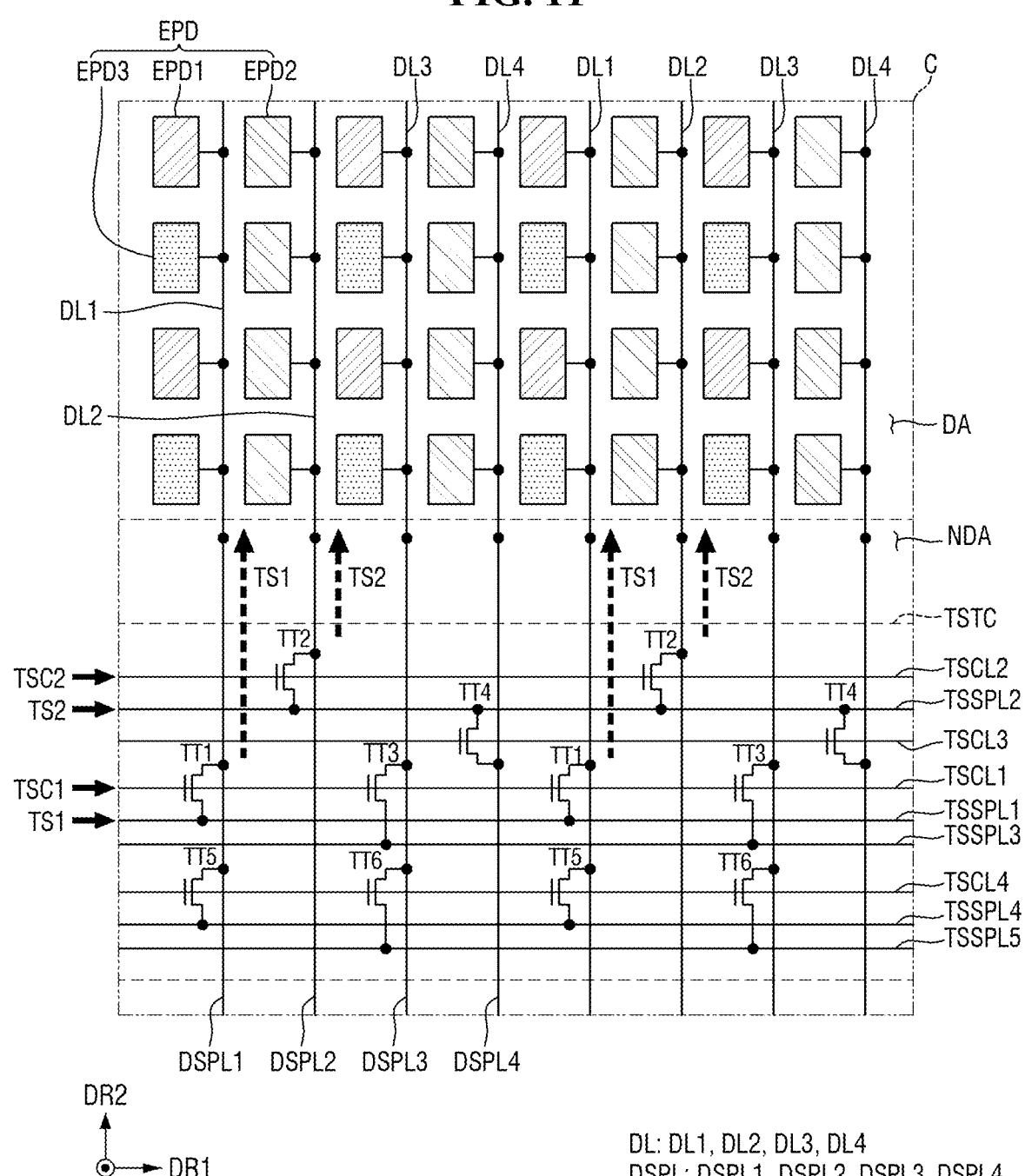
FIGS. 11, 12, 13, 14, 15, 16, 17 and 18 are layout diagrams showing the operation of the defect inspection circuit unit in the short-circuit inspection mode.

As shown in FIG. 11, in the first short-circuit inspection mode, the first inspection control line TSCL1 and the second inspection control line TSCL2 may transmit the first inspection control signal TSC1 and the second inspection control signal TSC2, and the first inspection signal supply line TSSPL1 and the second inspection signal supply line TSSPL2 may transmit the first inspection signal TS1 and the second inspection signal TS2, respectively.

Accordingly, in the first short-circuit inspection mode, the defect inspection circuit unit TSTC may transmit the first inspection signal TS1 to the first data line DL1 through the first inspection transistor TT1 turned on by the first inspection control signal TSC1, and may transmit the second inspection signal TS2 to the second data line DL2 through the second inspection transistor TT2 turned on by the second inspection control signal TSC2.

Figure 12:
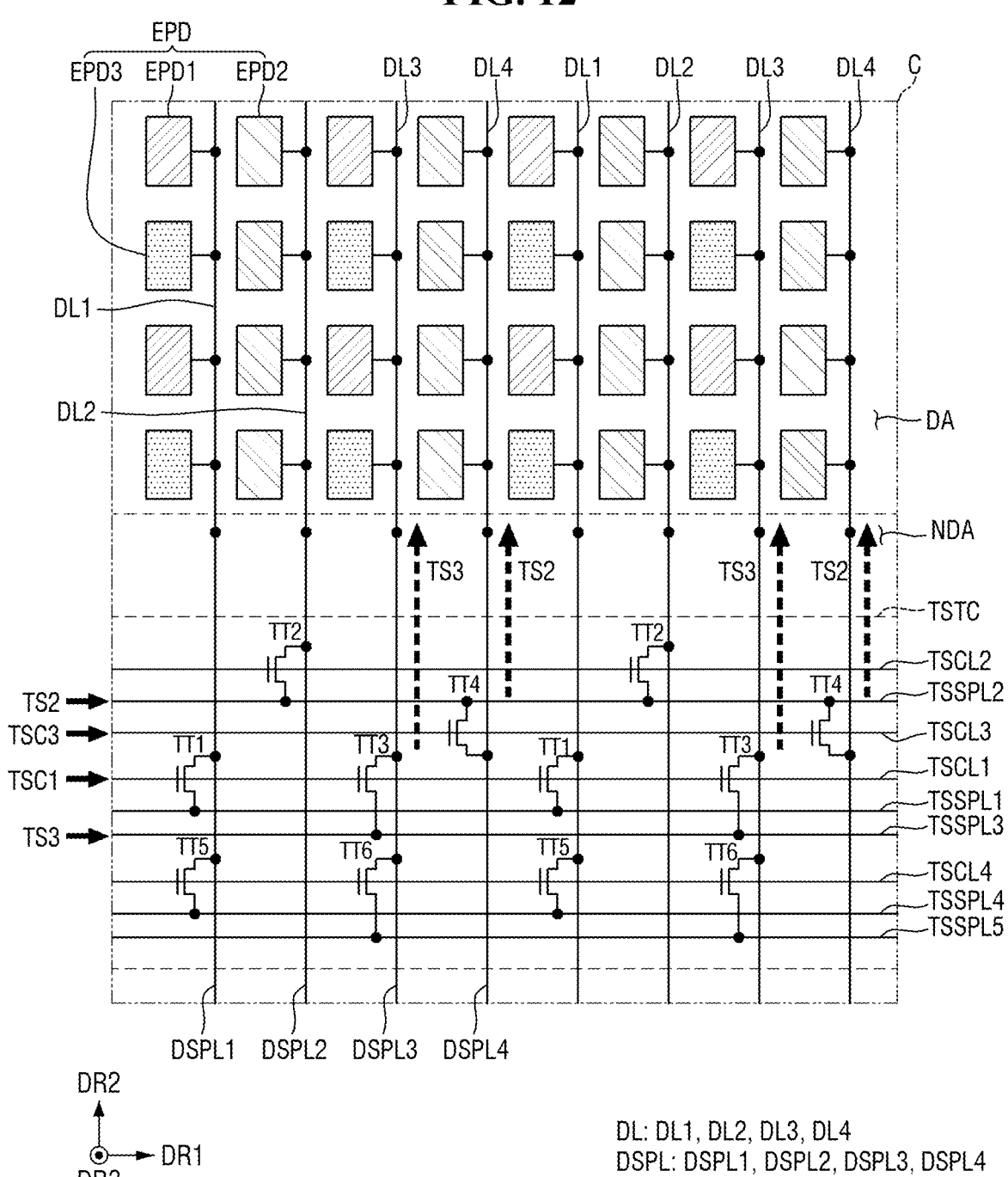

Alternatively, as shown in FIG. 12, in the first short-circuit inspection mode, the third inspection control line TSCL3, not the second inspection control line TSCL2, may transmit the third inspection control signal TSC3, and the third inspection signal supply line TSSPL3, not the first inspection signal supply line TSSPL1, may transmit the third inspection signal TS3.

That is, the first inspection control line TSCL1 and the third inspection control line TSCL3 may transmit the first inspection control signal TSC1 and the third inspection control signal TSC3, and the third inspection signal supply line TSSPL3 and the second inspection signal supply line TSSPL2 may transmit the third inspection signal TS3 and the second inspection signal TS2, respectively.

In this case, in the first short-circuit inspection mode, the defect inspection circuit unit TSTC may transmit the third inspection signal TS3 to the third data line DL3 through the third inspection transistor TT3 turned on by the first inspection control signal TSC1, and may transmit the second inspection signal TS2 to the fourth data line DL4 through the fourth inspection transistor TT4 turned on by the second inspection control signal TSC2.

Figure 13:
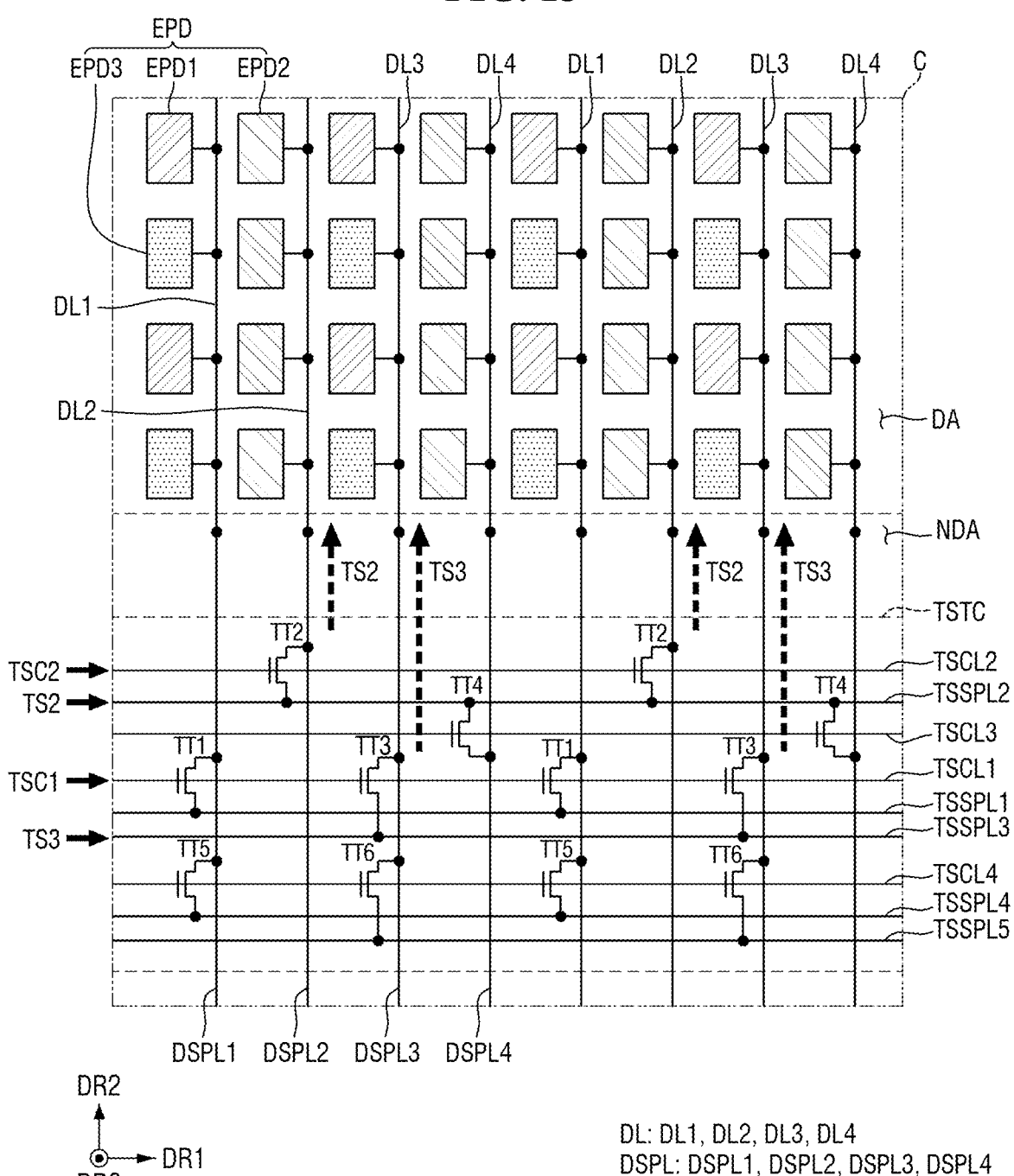

As shown in FIG. 13, in the second short-circuit inspection mode, the first inspection control line TSCL1 and the second inspection control line TSCL2 may transmit the first inspection control signal TSC1 and the second inspection control signal TSC2, and the third inspection signal supply line TSSPL3 and the second inspection signal supply line TSSPL2 may transmit the third inspection signal TS3 and the second inspection signal TS2, respectively.

Accordingly, in the second short-circuit inspection mode, the defect inspection circuit unit TSTC may transmit the third inspection signal TS3 to the third data line DL3 through the third inspection transistor TT3 turned on by the first inspection control signal TSC1, and may transmit the second inspection signal TS2 to the second data line DL2 through the second inspection transistor TT2 turned on by the second inspection control signal TSC2.

Figure 14:
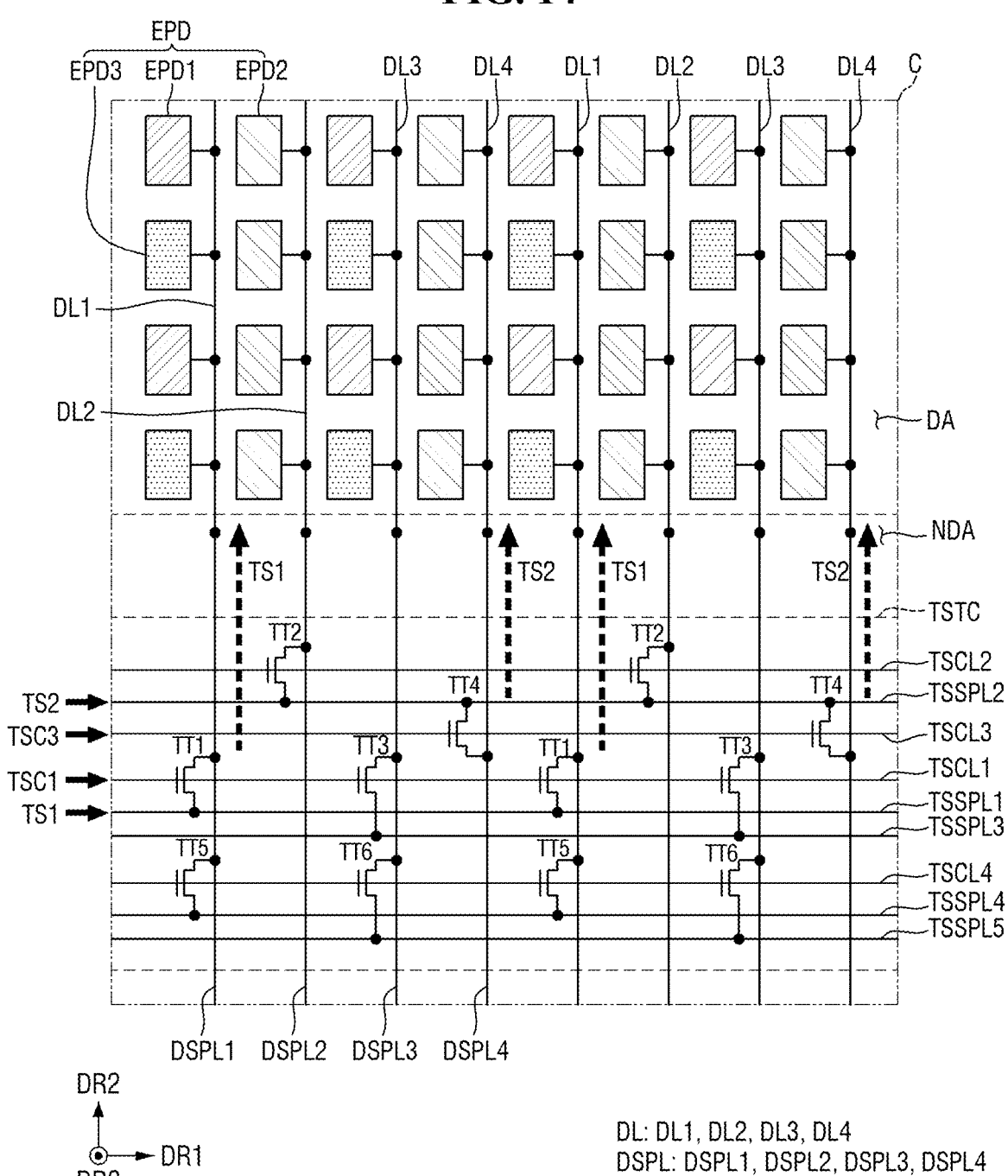

Alternatively, as shown in FIG. 14, in the second short-circuit inspection mode, the third inspection control line TSCL3, not the second inspection control line TSCL2, may transmit the third inspection control signal TSC3, and the first inspection signal supply line TSSPL1, not the third inspection signal supply line TSSPL3, may transmit the first inspection signal TS1.

That is, the first inspection control line TSCL1 and the third inspection control line TSCL3 may transmit the first inspection control signal TSC1 and the third inspection control signal TSC3, and the first inspection signal supply line TSSPL1 and the second inspection signal supply line TSSPL2 may transmit the first inspection signal TS1 and the second inspection signal TS2, respectively.

Accordingly, in the second short-circuit inspection mode, the defect inspection circuit unit TSTC may transmit the first inspection signal TS1 to the first data line DL1 through the first inspection transistor TT1 turned on by the first inspection control signal TSC1, and may transmit the second inspection signal TS2 to the fourth data line DL4 through the fourth inspection transistor TT4 turned on by the second inspection control signal TSC2.

FIGS. 11, 12, 13 and 14 illustrate a case in which the defect inspection circuit unit TSTC of the short-circuit inspection mode transmits one of the first inspection signal TS1 and the third inspection signal TS3 to the first data line DL1 and the third data line DL3.

However, as shown in FIGS. 15, 16, 17, and 18, the defect inspection circuit unit TSTC of the short-circuit inspection mode may transmit one of the fourth inspection signal TS4 and the fifth inspection signal TS5 to the first data line DL1 and the third data line DL3.

Figure 15:
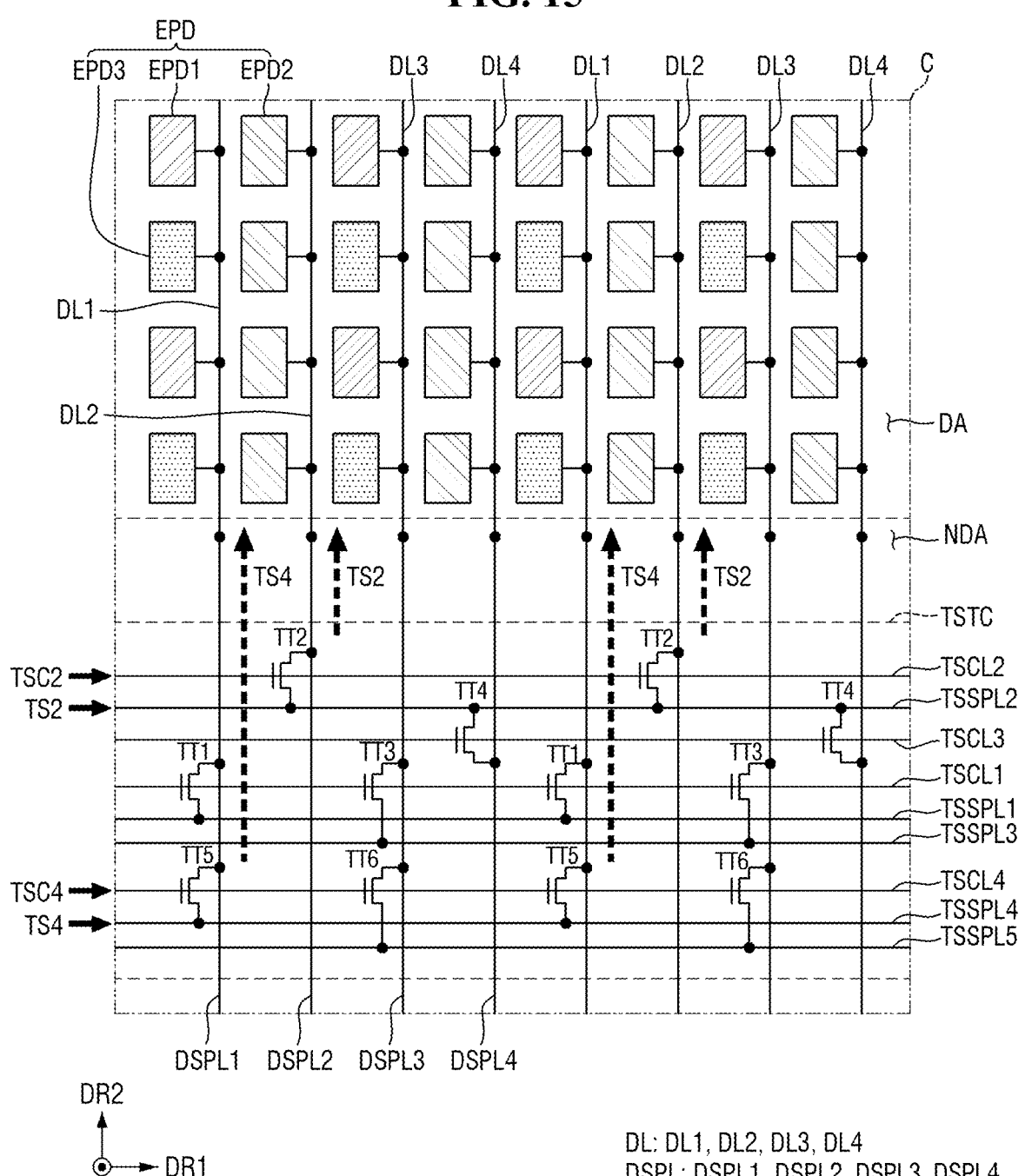

As shown in FIG. 15, in the first short-circuit inspection mode, the fourth inspection control line TSCL4 and the second inspection control line TSCL2 may transmit the fourth inspection control signal TSC4 and the second inspection control signal TSC2, and the fourth inspection signal supply line TSSPL4 and the second inspection signal supply line TSSPL2 may transmit the fourth inspection signal TS4 and the second inspection signal TS2, respectively.

Accordingly, in the first short-circuit inspection mode, the defect inspection circuit unit TSTC may transmit the fourth inspection signal TS4 to the first data line DL1 through the fifth inspection transistor TT5 turned on by the fourth inspection control signal TSC4, and may transmit the second inspection signal TS2 to the second data line DL2 through the second inspection transistor TT2 turned on by the second inspection control signal TSC2.

Figure 16:
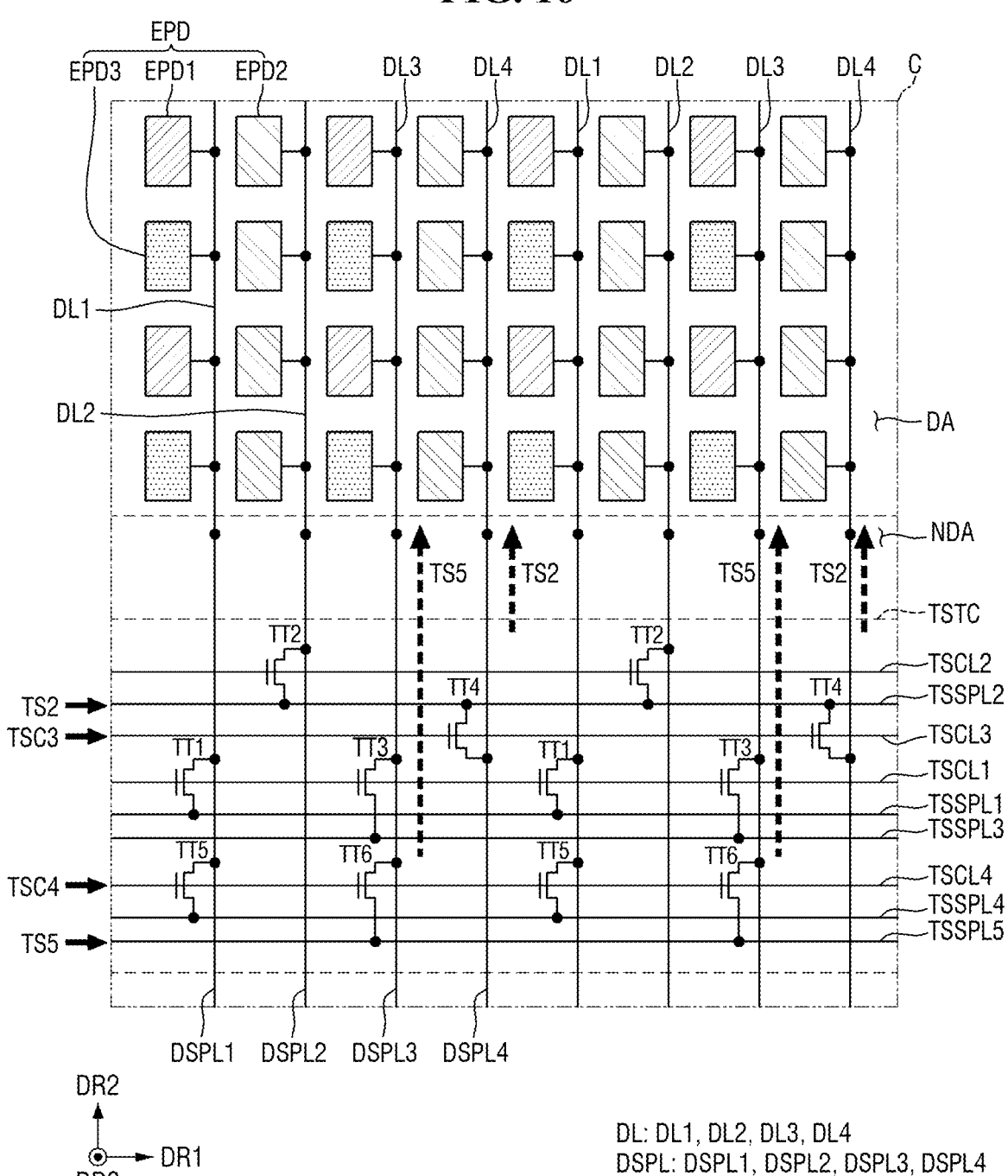

Alternatively, as shown in FIG. 16, in the first short-circuit inspection mode, the fourth inspection control line TSCL4 and the third inspection control line TSCL3 may transmit the fourth inspection control signal TSC4 and the third inspection control signal TSC3, and the fifth inspection signal supply line TSSPL5 and the second inspection signal supply line TSSPL2 may transmit the fifth inspection signal TS5 and the second inspection signal TS2, respectively.

In this case, in the first short-circuit inspection mode, the defect inspection circuit unit TSTC may transmit the fifth inspection signal TS5 to the third data line DL3 through the sixth inspection transistor TT6 turned on by the fourth inspection control signal TSC4, and may transmit the second inspection signal TS2 to the fourth data line DL4 through the fourth inspection transistor TT4 turned on by the second inspection control signal TSC2.

Figure 17:
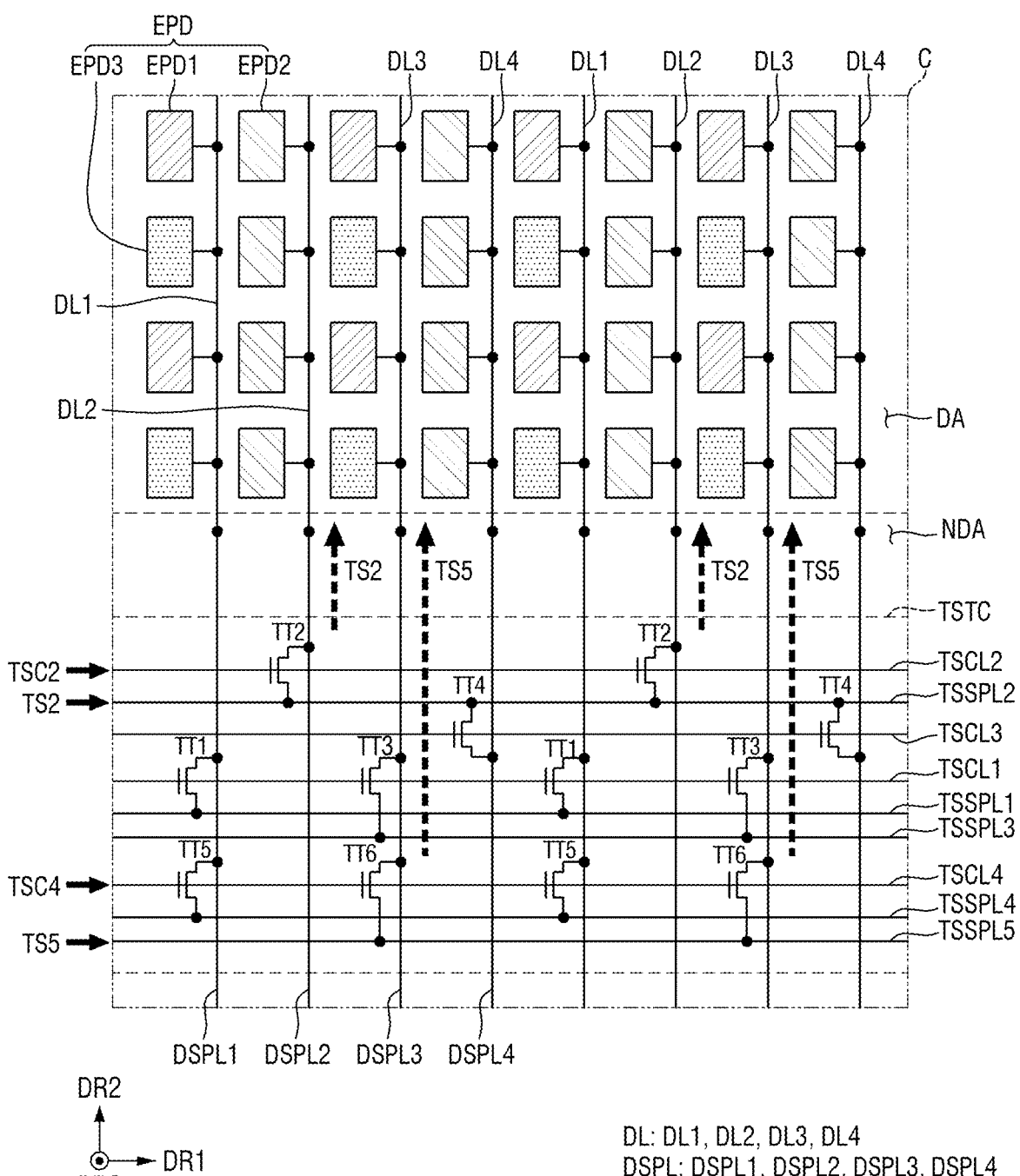

As shown in FIG. 17, in the second short-circuit inspection mode, the fourth inspection control line TSCL4 and the second inspection control line TSCL2 may transmit the fourth inspection control signal TSC4 and the second inspection control signal TSC2, and the fifth inspection signal supply line TSSPL5 and the second inspection signal supply line TSSPL2 may transmit the fifth inspection signal TS5 and the second inspection signal TS2, respectively.

Accordingly, in the second short-circuit inspection mode, the defect inspection circuit unit TSTC may transmit the fifth inspection signal TS5 to the third data line DL3 through the sixth inspection transistor TT6 turned on by the fourth inspection control signal TSC4, and may transmit the second inspection signal TS2 to the fourth data line DL4 through the fourth inspection transistor TT4 turned on by the second inspection control signal TSC2.

Figure 18:
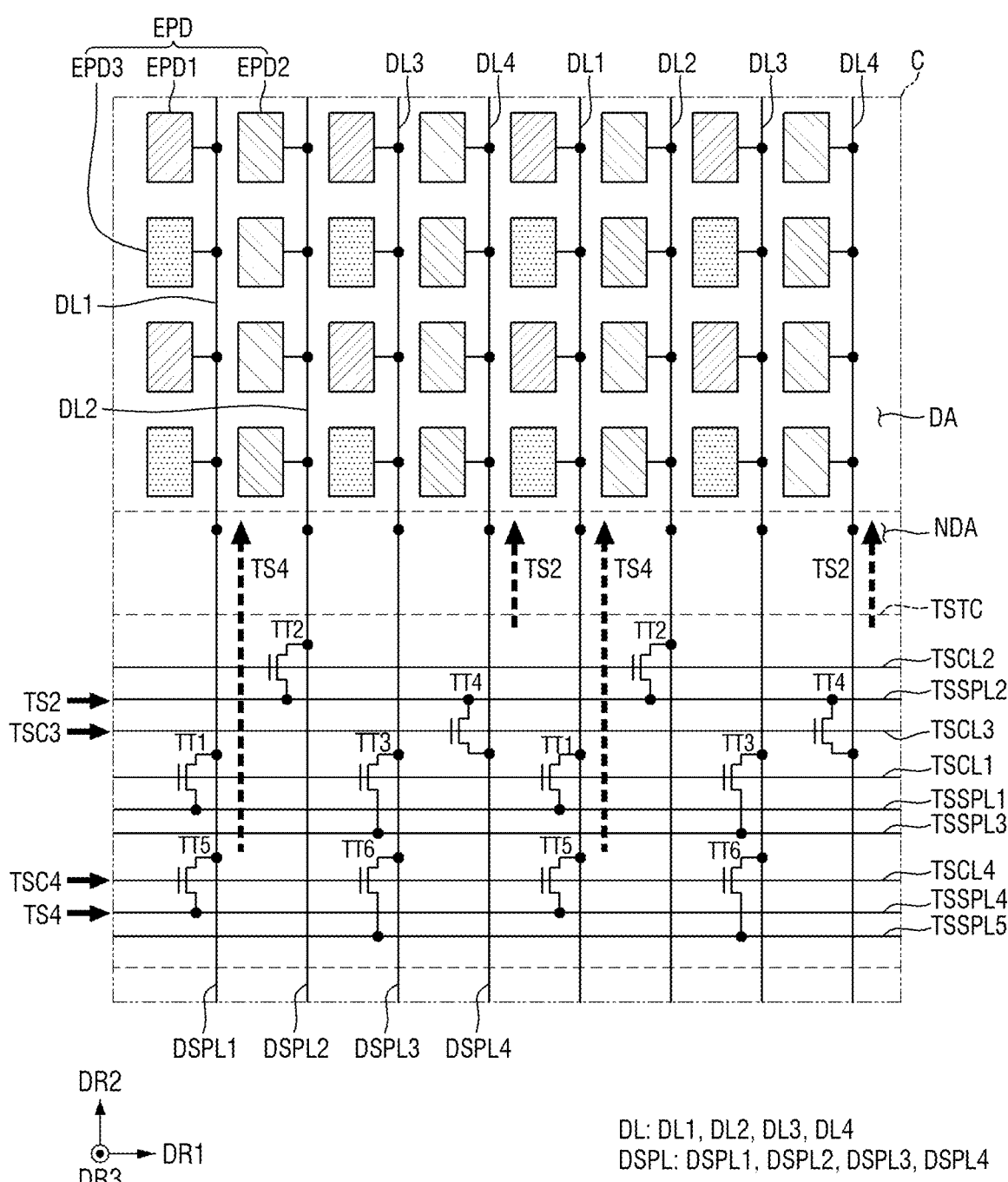

Alternatively, as shown in FIG. 18, in the second short-circuit inspection mode, the fourth inspection control line TSCL4 and the third inspection control line TSCL3 may transmit the fourth inspection control signal TSC4 and the third inspection control signal TSC3, and the fourth inspection signal supply line TSSPL4 and the second inspection signal supply line TSSPL2 may transmit the fourth inspection signal TS4 and the second inspection signal TS2, respectively.

Accordingly, in the second short-circuit inspection mode, the defect inspection circuit unit TSTC may transmit the fourth inspection signal TS4 to the first data line DL1 through the fifth inspection transistor TT5 turned on by the fourth inspection control signal TSC4, and may transmit the second inspection signal TS2 to the fourth data line DL4 through the fourth inspection transistor TT4 turned on by the second inspection control signal TSC2.

However, the aspects of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:
1. A display device comprising:
a substrate comprising a display area in which emission areas are arranged, and a non-display area around the display area;
a circuit layer above the substrate, and comprising:
light-emitting pixel drivers arranged side by side in a first direction and a second direction;
data lines extending in the second direction, configured to transmit a data signal to the light-emitting pixel drivers, and comprising a first data line, a second data line, a third data line, and a fourth data line arranged adjacent to each other in the first direction; and
a defect inspection circuit unit at the non-display area, and configured to supply inspection signals to the data lines, and comprising:
a first inspection transistor electrically connected between the first data line and a first inspection signal supply line configured to transmit a first inspection signal;
a second inspection transistor electrically connected between the second data line and a second inspection signal supply line configured to transmit a second inspection signal;

a third inspection transistor electrically connected between the third data line and a third inspection signal supply line configured to transmit a third inspection signal; and
a fourth inspection transistor electrically connected between the fourth data line and the second inspection signal supply line; and
an element layer above the circuit layer, and comprising light-emitting elements respectively at the emission areas and electrically connected to the light-emitting pixel drivers.
2. The display device of claim 1, wherein the first inspection transistor and the third inspection transistor are configured to be turned on by a first inspection control signal of a first inspection control line,
wherein the second inspection transistor is configured to be turned on by a second inspection control signal of a second inspection control line, and
wherein the fourth inspection transistor is configured to be turned on by a third inspection control signal of a third inspection control line.
3. The display device of claim 1, wherein the defect inspection circuit unit further comprises:
a fifth inspection transistor electrically connected between the first data line and a fourth inspection signal supply line configured to transmit a fourth inspection signal; and
a sixth inspection transistor electrically connected between the third data line and a fifth inspection signal supply line configured to transmit a fifth inspection signal,
wherein the first inspection transistor and the third inspection transistor are configured to be turned on by a first inspection control signal of a first inspection control line,
wherein the second inspection transistor is configured to be turned on by a second inspection control signal of a second inspection control line,
wherein the fourth inspection transistor is configured to be turned on by a third inspection control signal of a third inspection control line, and
wherein the fifth inspection transistor and the sixth inspection transistor are configured to be turned on by a fourth inspection control signal of a fourth inspection control line.
4. The display device of claim 3, wherein the emission areas comprise:
first emission areas configured to emit light of a first color;
second emission areas configured to emit light of a second color corresponding to a wavelength band that is lower than that of the first color; and
third emission areas configured to emit light of a third color corresponding to a wavelength band that is lower than that of the second color,
wherein the light-emitting pixel drivers comprise:
first light-emitting pixel drivers electrically connected to the light-emitting elements of the first emission areas;
second light-emitting pixel drivers electrically connected to the light-emitting elements of the second emission areas; and
third light-emitting pixel drivers electrically connected to the light-emitting elements of the third emission areas,
wherein the first light-emitting pixel drivers and the third light-emitting pixel drivers are alternately arranged in the second direction,
wherein the second light-emitting pixel drivers are arranged side by side in the second direction, wherein the first data line and the third data line are respectively electrically connected to the first light-emitting pixel drivers and the third light-emitting pixel drivers, and wherein the second data line and the fourth data line are electrically connected to the second light-emitting pixel drivers.

5. The display device of claim 4, wherein, in a first lighting inspection mode for the first emission areas, the defect inspection circuit unit is configured to transmit, through the first inspection transistor, the first inspection signal to some of the first light-emitting pixel drivers electrically connected to the first data line, and is configured to transmit, through the third inspection transistor, the third inspection signal to some other first light-emitting pixel drivers electrically connected to the third data line.

6. The display device of claim 4, wherein, in a second lighting inspection mode for the second emission areas, the defect inspection circuit unit is configured to transmit, through the second inspection transistor, the second inspection signal to some of the second light-emitting pixel drivers electrically connected to the second data line, and is configured to transmit, through the fourth inspection transistor, the second inspection signal to some other second light-emitting pixel drivers electrically connected to the fourth data line.

7. The display device of claim 4, wherein, in a third lighting inspection mode for the third emission areas, the defect inspection circuit unit is configured to transmit, through the fifth inspection transistor, the fourth inspection signal to some of the third light-emitting pixel drivers electrically connected to the first data line, and is configured to transmit, through the sixth inspection transistor, the fifth inspection signal to some other third light-emitting pixel drivers electrically connected to the third data line.

8. The display device of claim 2, further comprising a display-driving circuit configured to supply the data signal, wherein the circuit layer further comprises data supply lines at the non-display area, extending to the display-driving circuit, and electrically connecting the data lines and the display-driving circuit, and wherein the data supply lines comprise a first data supply line electrically connected to the first data line, a second data supply line electrically connected to the second data line, a third data supply line electrically connected to the third data line, and a fourth data supply line electrically connected to the fourth data line, wherein, in a short-circuit inspection mode for detecting whether there is a short circuit between the first data supply line and the fourth data supply line, or whether there is a short circuit between the second data supply line and the third data supply line, the defect inspection circuit unit is configured to transmit the first inspection signal to the first data line through the first inspection transistor, and is configured to transmit the second inspection signal to the second data line through the second inspection transistor.

9. The display device of claim 8, wherein, in a short-circuit inspection mode for detecting whether there is a short circuit between the second data supply line and the third data supply line, or whether there is a short circuit between the first data supply line and the fourth data supply line, the defect inspection circuit unit is configured to transmit the third inspection signal to the third data line through the third inspection transistor, and is configured to transmit the second inspection signal to the fourth data line through the fourth inspection transistor.

10. The display device of claim 8, wherein, in a short-circuit inspection mode for detecting whether there is a short circuit between the first data supply line and the second data supply line, or whether there is a short circuit between the third data supply line and the fourth data supply line, the defect inspection circuit unit is configured to transmit the second inspection signal to the second data line through the second inspection transistor, and is configured to transmit the third inspection signal to the third data line through the third inspection transistor.

11. The display device of claim 8, wherein, in a short-circuit inspection mode for detecting whether there is a short circuit between the first data supply line and the second data supply line, or whether there is a short circuit between the third data supply line and the fourth data supply line, the defect inspection circuit unit is configured to transmit the first inspection signal to the first data line through the first inspection transistor, and is configured to transmit the second inspection signal to the fourth data line through the fourth inspection transistor.

12. The display device of claim 8, wherein the substrate comprises:

a main region comprising the display area and the non-display area; and a sub-region protruding from one side of the main region, wherein the display-driving circuit is at the sub-region.

13. A display device comprising:

a substrate comprising a display area in which emission areas are arranged, and a non-display area around the display area;

a circuit layer above the substrate, and comprising:

light-emitting pixel drivers arranged side by side in a first direction and a second direction;

data lines extending in the second direction and configured to transmit a data signal to the light-emitting pixel drivers; and a defect inspection circuit unit at the non-display area, and configured to:

supply inspection signals to the data lines;

operate in a lighting inspection mode for detecting a normal or abnormal status of a light-emitting element for ones of the emission areas of a same color; and operate in a short-circuit inspection mode for detecting a short circuit between neighboring data lines among the data lines; and an element layer above the circuit layer, and comprising light-emitting elements respectively at the emission areas, and respectively electrically connected to the light-emitting pixel drivers.

14. The display device of claim 13, wherein the defect inspection circuit unit comprises:

a first inspection transistor electrically connected between a first data line of the data lines and a first inspection signal supply line that is configured to transmit a first inspection signal;

a second inspection transistor electrically connected between a second data line of the data lines and a second inspection signal supply line that is configured to transmit a second inspection signal;

a third inspection transistor electrically connected between a third data line of the data lines and a third inspection signal supply line that is configured to transmit a third inspection signal;

a fourth inspection transistor electrically connected between a fourth data line of the data lines and the second inspection signal supply line;

a fifth inspection transistor electrically connected between the first data line and a fourth inspection signal supply line that is configured to transmit a fourth inspection signal; and a sixth inspection transistor electrically connected between the third data line and a fifth inspection signal supply line that is configured to transmit a fifth inspection signal, wherein the first inspection transistor and the third inspection transistor are configured to be turned on by a first inspection control signal of a first inspection control line, wherein the second inspection transistor is configured to be turned on by a second inspection control signal of a second inspection control line, wherein the fourth inspection transistor is configured to be turned on by a third inspection control signal of a third inspection control line, and wherein the fifth inspection transistor and the sixth inspection transistor are configured to be turned on by a fourth inspection control signal of a fourth inspection control line.

15. The display device of claim 14, wherein the emission areas comprise:

first emission areas configured to emit light of a first color;

second emission areas configured to emit light of a second color corresponding to a wavelength band that is lower than that of the first color; and third emission areas configured to emit light of a third color corresponding to a wavelength band that is lower than that of the second color, wherein the light-emitting pixel drivers comprise:

first light-emitting pixel drivers electrically connected to the light-emitting elements of the first emission areas;

second light-emitting pixel drivers electrically connected to the light-emitting elements of the second emission areas; and third light-emitting pixel drivers electrically connected to the light-emitting elements of the third emission areas, wherein the first light-emitting pixel drivers and the third light-emitting pixel drivers are alternately arranged in the second direction, wherein the second light-emitting pixel drivers are arranged side by side in the second direction, wherein the first data line, the second data line, the third data line, and the fourth data line are arranged adjacent to each other in the first direction, wherein the first data line and the third data line are respectively electrically connected to the first light-emitting pixel drivers and the third light-emitting pixel drivers, and wherein the second data line and the fourth data line are electrically connected to the second light-emitting pixel drivers.

16. The display device of claim 15, wherein, in a first lighting inspection mode for the first emission areas, the defect inspection circuit unit is configured to transmit, through the first inspection transistor, the first inspection signal of the first inspection signal supply line to some of the first light-emitting pixel drivers electrically connected to the first data line, and is configured to transmit, through the third inspection transistor, the third inspection signal of the third inspection signal supply line to some other first light-emitting pixel drivers electrically connected to the third data line, wherein, in a second lighting inspection mode for the second emission areas, the defect inspection circuit unit is configured to transmit, through the second inspection transistor, the second inspection signal of the second inspection signal supply line to some of the second light-emitting pixel drivers electrically connected to the second data line, and is configured to transmit, through the fourth inspection transistor, the second inspection signal to some other second light-emitting pixel drivers electrically connected to the fourth data line, and wherein, in a third lighting inspection mode for the third emission areas, the defect inspection circuit unit is configured to transmit, through the fifth inspection transistor, the fourth inspection signal of the fourth inspection signal supply line to some of the third light-emitting pixel drivers electrically connected to the first data line, and is configured to transmit, through the sixth inspection transistor, the fifth inspection signal of the fifth inspection signal supply line to some other third light-emitting pixel drivers electrically connected to the third data line.

17. The display device of claim 14, wherein, in a first short-circuit inspection mode for detecting whether there is a short circuit between the first data line and the fourth data line, or whether there is a short circuit between the second data line and the third data line, the defect inspection circuit unit is configured to transmit one of the first inspection signal and the fourth inspection signal to the first data line, and is configured to transmit the second inspection signal to one of the second data line and the fourth data line.

18. The display device of claim 17, wherein, in a second short-circuit inspection mode for detecting whether there is a short circuit between the first data line and the second data line, or whether there is a short circuit between the third data line and the fourth data line, the defect inspection circuit unit is configured to transmit one of the third inspection signal and the fifth inspection signal to the third data line, and is configured to transmit the second inspection signal to one of the second data line and the fourth data line.

19. An electronic device comprising a display device comprising:

a substrate comprising a display area in which emission areas are arranged, and a non-display area around the display area;

a circuit layer above the substrate, and comprising:

light-emitting pixel drivers arranged side by side in a first direction and a second direction;

data lines extending in the second direction, configured to transmit a data signal to the light-emitting pixel drivers, and comprising a first data line, a second data line, a third data line, and a fourth data line arranged adjacent to each other in the first direction; and a defect inspection circuit unit at the non-display area, and configured to supply inspection signals to the data lines, and comprising:

a first inspection transistor electrically connected between the first data line and a first inspection signal supply line configured to transmit a first inspection signal;

a second inspection transistor electrically connected between the second data line and a second inspection signal supply line configured to transmit a second inspection signal;

a third inspection transistor electrically connected between the third data line and a third inspection signal supply line configured to transmit a third inspection signal; and a fourth inspection transistor electrically connected between the fourth data line and the second inspection signal supply line; and an element layer above the circuit layer, and comprising light-emitting elements respectively at the emission areas and electrically connected to the light-emitting pixel drivers.

20. The electronic device of claim 19, wherein the electronic device comprises a smartphone, a television, a monitor, a tablet, an electric vehicle, a mobile phone, a tablet personal computer (PC), a mobile communication terminal, an electronic notebook, an electronic book, a portable multimedia player (PMP), a navigation device, an ultra-mobile PC (UMPC), a laptop computer, a billboard, an Internet of Things (IoT) device, a smartwatch, a watch phone, or a head-mounted display (HMD).

*  *  *  *  *